US012808954B2

(12) United States Patent
Hiraki et al.

(10) Patent No.: US 12,808,954 B2

(45) Date of Patent: Nov. 24, 2026

(54) MAGNETIC SENSOR AND MAGNETIC SENSOR SYSTEM

(71) Applicant: TDK CORPORATION, Tokyo (JP)

(72) Inventors: Tetsuya Hiraki, Tokyo (JP); Kenzo Makino, Tokyo (JP); Naoki Ohta, Tokyo (JP)

(73) Assignee: TDK CORPORATION, Tokyo (JP)

( * ) Notice: Subject to any disclaimer, the term of this patent is extended or adjusted under 35 U.S.C. 154(b) by 138 days.

(21) Appl. No.: 19/001,724

(22) Filed: Dec. 26, 2024

(65) Prior Publication Data

US 2025/0123340 A1 Apr. 17, 2025

Related U.S. Application Data

(63) Continuation of application No. 17/896,859, filed on Aug. 26, 2022, now Pat. No. 12,216,183.

(60) Provisional application No. 63/238,492, filed on Aug. 30, 2021.

(30) Foreign Application Priority Data

Aug. 5, 2022 (JP) ................................ 2022-125580

(51) Int. Cl.
*G01R 33/09* (2006.01)

(52) U.S. Cl.
CPC .................................... *G01R 33/09* (2013.01)

(58) Field of Classification Search
CPC ........................... G01R 33/09; G01R 33/0005; G01R 33/0023; G01R 33/093; G01R 33/098; G01R 33/0094
See application file for complete search history.

(56) References Cited

U.S. PATENT DOCUMENTS

| | | | | |
|---|---|---|---|---|
| 10,416,000 | B2 * | 9/2019 | Ohta | G01R 33/098 |
| 2014/0292314 | A1 | 10/2014 | Tokida et al. | |
| 2015/0255515 | A1 * | 9/2015 | Nakai | G11C 11/1655 365/158 |
| 2016/0209241 | A1 | 7/2016 | Mitsuhashi | |
| 2017/0328963 | A1 | 11/2017 | Schmitt et al. | |

(Continued)

FOREIGN PATENT DOCUMENTS

| | | | |
|---|---|---|---|
| CN | 205720614 | U | 11/2016 |
| CN | 112652708 | A | 4/2021 |
| JP | 2011-047929 | A | 3/2011 |

(Continued)

OTHER PUBLICATIONS

Translation of Feb. 3, 2026 Office Action issued in Japanese Application No. 2022-125580.

(Continued)

*Primary Examiner* — Alesa Allgood
(74) *Attorney, Agent, or Firm* — Oliff PLC

(57) ABSTRACT

A magnetic sensor includes a first path and a second path, a plurality of structures, and a plurality of first electrodes and a plurality of second electrodes. The first path includes at least one first array. The second path includes at least one second array. The at least one first array and the at least one second array are disposed so that they are arranged in a first direction. The at least one first array and the at least one second array each include an odd number of structures disposed so that they are arranged in a second direction.

22 Claims, 11 Drawing Sheets

(56) References Cited

U.S. PATENT DOCUMENTS

2021/0096196 A1* 4/2021 Cai .................... G01R 33/0076

FOREIGN PATENT DOCUMENTS

| | | |
|---|---|---|
| JP | 2014-025856 A | 2/2014 |
| JP | 2016-128768 A | 7/2016 |
| JP | 2021-056170 A | 4/2021 |

OTHER PUBLICATIONS

May 28, 2024 U.S. Office Action issued in U.S. Appl. No. 17/896,859.

* cited by examiner

MAGNETIC SENSOR AND MAGNETIC SENSOR SYSTEM

CROSS REFERENCE TO RELATED APPLICATIONS

This application is a continuation of U.S. patent application Ser. No. 17/896,859, filed Aug. 26, 2022, which claims the benefit of U.S. Provisional Patent Application No. 63/238,492 filed on Aug. 30, 2021 and Japanese Priority Patent Application No. 2022-125580 filed on Aug. 5, 2022, the entire contents of each of which are incorporated herein by their reference.

BACKGROUND

The technology relates to a magnetic sensor including a plurality of magnetoresistive elements connected in series, and a magnetic sensor system.

Magnetic sensors have been used for a variety of applications. Examples of known magnetic sensors include one that uses a spin-valve magnetoresistive element provided on a substrate. As the magnetoresistive element, a tunnel magnetoresistive (TMR) element or a giant magnetoresistive (GMR) element is used, for example. As the GMR element, for example, a current perpendicular-to-plane (CPP) GMR element where a current is passed in a direction substantially perpendicular to the layers constituting the GMR element is used.

If TMR elements or CPP GMR elements are used as magnetoresistive elements, a plurality of magnetoresistive elements are connected in series by a plurality of lower electrodes and a plurality of upper electrodes. For example, U.S. Pat. No. 10,416,000 B2 discloses a magnetic sensor including a plurality of magnetoresistive elements. In the magnetic sensor, the magnetoresistive elements are disposed on the top surfaces of the respective lower electrodes, near both longitudinal ends of each lower electrode. Each of the upper electrodes electrically connect two adjoining magnetoresistive elements disposed on two lower electrodes adjoining in the longitudinal direction of the lower electrodes, whereby the plurality of magnetoresistive elements are connected in series.

Here, a row of magnetoresistive elements will be referred to as an array. In an array, a plurality of magnetoresistive elements are connected in series by a plurality of lower electrodes and a plurality of upper electrodes. If arrays constituting one resistor section and arrays constituting another resistor section are alternately arranged, a contrivance to connect the arrays at every other row is needed.

To reduce variations in characteristics such as a resistance value between the plurality of arrays, a contrivance to make the numbers of lower electrodes and the numbers of upper electrodes included in the respective arrays the same is also needed.

SUMMARY

A magnetic sensor according to an embodiment of the technology includes a first path and a second path through each of which a current flows, a plurality of structures disposed on the first path and the second path, and a plurality of first electrodes and a plurality of second electrodes that connect the plurality of structures in series. As employed herein, a row of structures will be referred to as an array. The first path includes at least one first array. The second path includes at least one second array. The at least one first array and the at least one second array are disposed so that they are arranged in a first direction. The at least one first array and the at least one second array each include an odd number of structures among the plurality of structures, the odd number of structures being disposed so that they are arranged in a second direction. At least one of the odd number of structures is a structure including a magnetoresistive element. The plurality of first electrodes and the plurality of second electrodes are disposed at different positions in a third direction. The first electrodes and the second electrodes are alternately arranged one by one in a direction in which the current flows in each of the at least one first array and the at least one second array.

In the magnetic sensor according to the embodiment of the technology, each of the odd number of structures may have a first surface and a second surface located at both ends in the third direction. The first surface may be connected to one of the first electrodes. The second surface may be connected to one of the second electrodes.

In the magnetic sensor according to the embodiment of the technology, the number of first electrodes included in the at least one first array, the number of second electrodes included in the at least one first array, the number of first electrodes included in the at least one second array, and the number of second electrodes included in the at least one second array may be the same.

In the magnetic sensor according to the embodiment of the technology, each of the odd number of structures may be a structure including the magnetoresistive element.

In the magnetic sensor according to the embodiment of the technology, at least one of the odd number of structures other than the one including the magnetoresistive element may be a connection structure configured to connect one of the first electrodes and one of the second electrodes.

In the magnetic sensor according to the embodiment of the technology, the number of magnetoresistive elements included in the first path and the number of magnetoresistive elements included in the second path may be the same.

In the magnetic sensor according to the embodiment of the technology, the first path may include a plurality of first arrays as the at least one first array. The second path may include a plurality of second arrays as the at least one second array. The plurality of first arrays and the plurality of second arrays may be disposed so that the first arrays and the second arrays are alternately arranged one by one in the first direction.

In the magnetic sensor according to the embodiment of the technology, the number of magnetoresistive elements included in each of the first path and the second path may be an even number.

In the magnetic sensor according to the embodiment of the technology, the at least one first array may include a first specific array located at an end in a direction parallel to the first direction. The at least one second array may include a second specific array located at an end in the direction parallel to the first direction. When seen in the third direction, a direction in which the current flows through the first specific array and a direction in which the current flows through the second specific array may be the same or opposite to each other.

The magnetic sensor according to the embodiment of the technology may further include at least one yoke formed of a soft magnetic material. The at least one yoke may have a first end face and a second end face located at both ends in the first direction. The at least one first array may be located near the first end face. The at least one second array may be located near the second end face.

The magnetic sensor according to the embodiment of the technology may further include a power supply terminal, one or two signal terminals, one or two first signal paths connecting the power supply terminal and the one or two signal terminals, and one or two second signal paths connecting the one or two signal terminals and a ground. The first path and the second path may be two of the one or two first signal paths and the one or two second signal paths.

The magnetic sensor according to the embodiment of the technology may further include a first power supply terminal, a second power supply terminal, one or two first signal terminals, one or two second signal terminals, one or two first signal paths connecting the first power supply terminal and the one or two first signal terminals, one or two second signal paths connecting the one or two first signal terminals and a ground, one or two third signal paths connecting the second power supply terminal and the one or two second signal terminals, and one or two fourth signal paths connecting the one or two second signal terminals and the ground. The first path may be one of the one or two first signal paths and the one or two second signal paths. The second path may be one of the one or two third signal paths and the one or two fourth signal paths.

In the magnetic sensor according to the embodiment of the technology, the first path may further include a first sub array disposed in the first path between one end of the first path and the at least one first array, and a second sub array disposed in the first path between the other end of the first path and the at least one first array. The second path may include a third sub array disposed in the second path between one end of the second path and the at least one second array, and a fourth sub array disposed in the second path between the other end of the second path and the at least one second array. Each of the first to fourth sub arrays may include as many structures as the odd number of structures among the plurality of structures. The as many structures as the odd number of structures may be disposed so that they are arranged in the second direction. At least one of the as many structures as the odd number of structures may be a structure including the magnetoresistive element. The first sub array and the one end of the first path, the second sub array and the other end of the first path, the third sub array and the one end of the second path, and the fourth sub array and the other end of the second path may be connected by respective ones of the second electrodes.

In the magnetic sensor according to the embodiment of the technology, the first path may further include a plurality of first sub arrays disposed in the first path between one end of the first path and the at least one first array, and a plurality of second sub arrays disposed in the first path between the other end of the first path and the at least one first array. The second path may further include a plurality of third sub arrays disposed in the second path between one end of the second path and the at least one second array, and a plurality of fourth sub arrays disposed in the second path between the other end of the second path and the at least one second array. The first sub arrays, the second sub arrays, the third sub arrays, and the fourth sub arrays may each include either more than one structure but fewer than the odd number of structures or one structure among the plurality of structures. Each of the more than one structure but fewer than the odd number of structures or the one structure may be a structure including the magnetoresistive element.

If the first path includes the plurality of first sub arrays and the plurality of second sub arrays and the second path includes the plurality of third sub arrays and the plurality of fourth sub arrays, the number of structures included in each of the first sub arrays may be smaller the closer the first sub array is to the one end of the first path. The number of structures included in each of the second sub arrays may be smaller the closer the second sub array is to the other end of the first path. The number of structures included in each of the third sub arrays may be smaller the closer the third sub array is to the one end of the second path. The number of structures included in each of the fourth sub arrays may be smaller the closer the fourth sub array is to the other end of the second path.

The magnetic sensor according to the embodiment of the technology may further include a plurality of electrode pads to which the first and second paths are connected. The plurality of electrode pads may be located at the same position in the third direction.

In the magnetic sensor according to the embodiment of the technology, a part of the first path and a part of the second path may be located at different positions in the third direction and may be connected to each other via a connection structure.

The magnetic sensor according to the embodiment of the technology may be configured to detect a component of a target magnetic field in one direction. Alternatively, the magnetic sensor according to the embodiment of the technology may be configured to detect components of a target magnetic field in two directions.

A magnetic sensor system according to the embodiment of the technology includes the magnetic sensor according to the embodiment of the technology, and a magnetic field generation unit configured to generate a predetermined magnetic field.

In the magnetic sensor and the magnetic sensor system according to the embodiment of the technology, the at least one first array and the at least one second array each include an odd number of structures. According to the embodiment of the technology, the numbers of first electrodes and the numbers of second electrodes included in the first arrays and the second arrays, respectively, can be made the same while connecting the first arrays and the second arrays at every other row.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
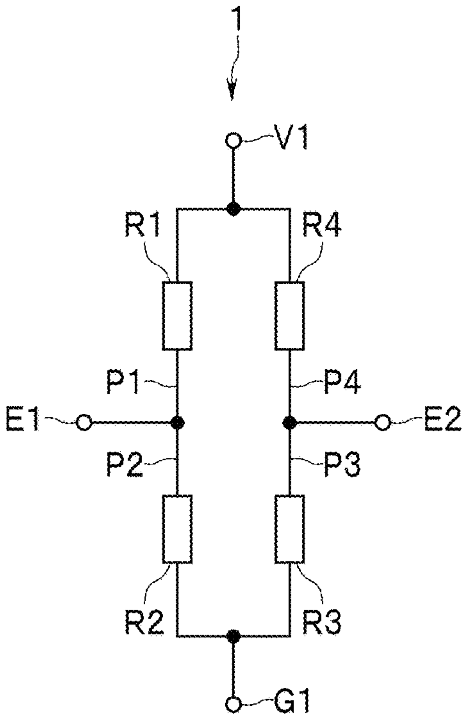
FIG. 1 is a circuit diagram showing a circuit configuration of a magnetic sensor according to a first example embodiment of the technology.

An object of the technology is to provide a magnetic sensor and a magnetic sensor system where the number of first electrodes and the number of second electrodes included in respective arrays can be made the same while connecting the arrays at every other row.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

A schematic configuration of a magnetic sensor 1 according to a first example embodiment of the technology will initially be described with reference to FIG. 1. FIG. 1 is a circuit diagram showing a circuit configuration of the magnetic sensor 1. The magnetic sensor 1 includes a power supply terminal, one or two signal terminals, one or two first signal paths connecting the power supply terminal and the one or two signal terminals, and one or two second signal paths connecting the one or two signal terminals and a ground. The magnetic sensor 1 further includes a ground terminal. In particular, in the example embodiment, the magnetic sensor 1 includes a power supply terminal V1, a ground terminal G1, two signal terminals E1 and E2, a signal path P1 connecting the power supply terminal V1 and the signal terminal E1, a signal path P4 connecting the power supply terminal V1 and the signal terminal E2, a signal path P2 connecting the signal terminal E1 and the ground terminal G1, and a signal path P3 connecting the signal terminal E2 and the ground terminal G1 as the power supply terminal, the ground terminal, the signal terminals, the first signal paths, and the second signal paths. A power supply voltage of predetermined magnitude is applied to the power supply terminal V1. The ground terminal G1 is grounded. A current flows through each of the signal paths P1 to P4.

The magnetic sensor 1 further includes a resistor section R1 disposed in the signal path P1, a resistor section R2 disposed in the signal path P2, a resistor section R3 disposed in the signal path P3, and a resistor section R4 disposed in the signal path P4. Each of the resistor sections R1 to R4 includes a plurality of magnetoresistive elements 20. Magnetoresistive elements will hereinafter be referred to as MR elements.

The magnetic sensor 1 generates two signals corresponding to the potentials of the signal terminals E1 and E2 or a signal corresponding to a potential difference between the signal terminals E1 and E2 as at least one detection signal.

Figure 2:
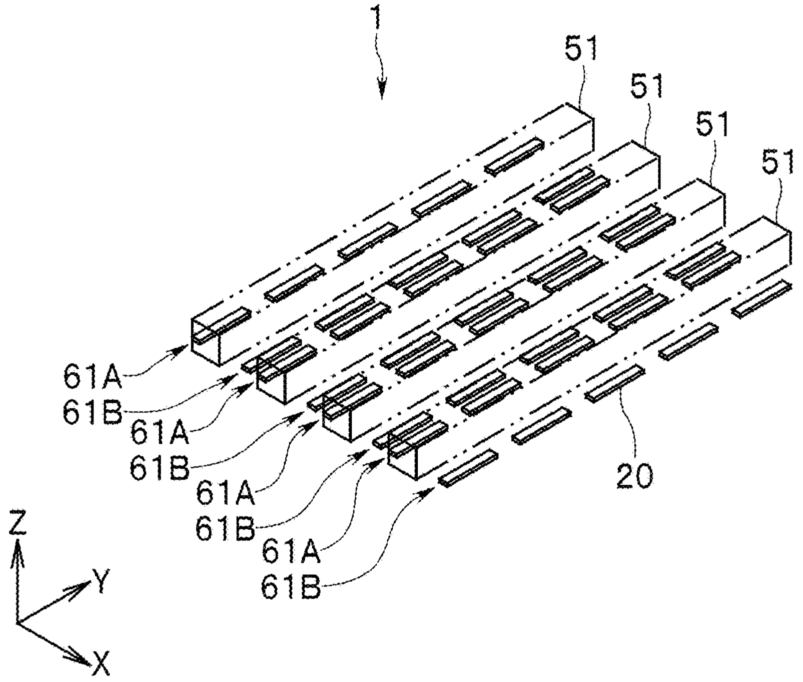
FIG. 2 is a perspective view showing a part of the magnetic sensor according to the first example embodiment of the technology.
Figure 3:
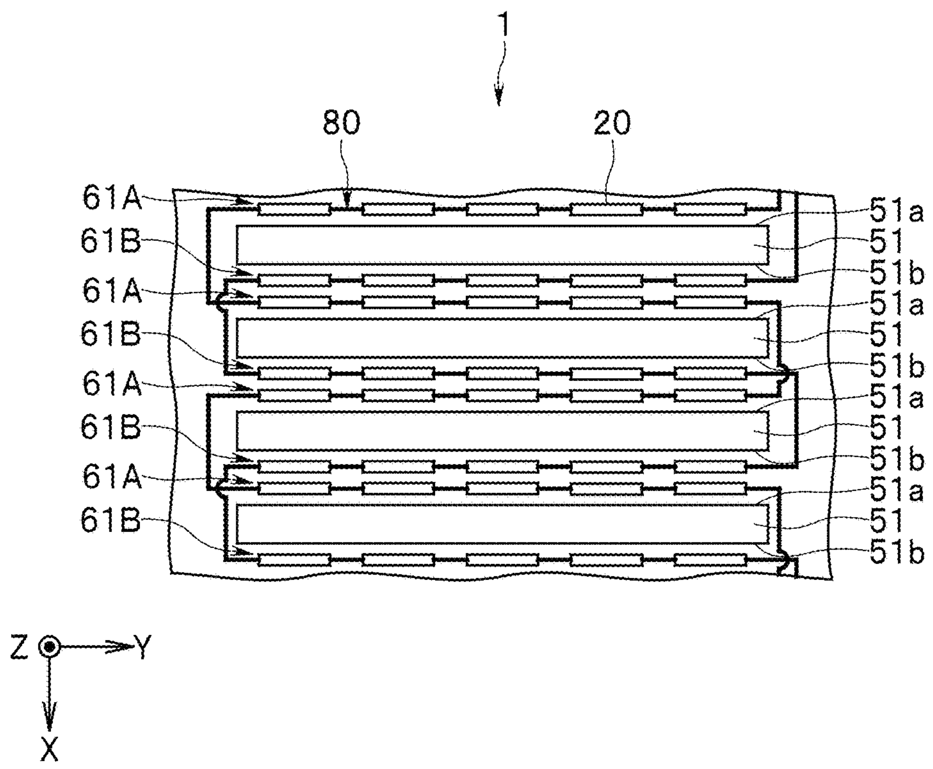
FIG. 3 is a plan view showing a part of the magnetic sensor according to the first example embodiment of the technology.
Figure 4:
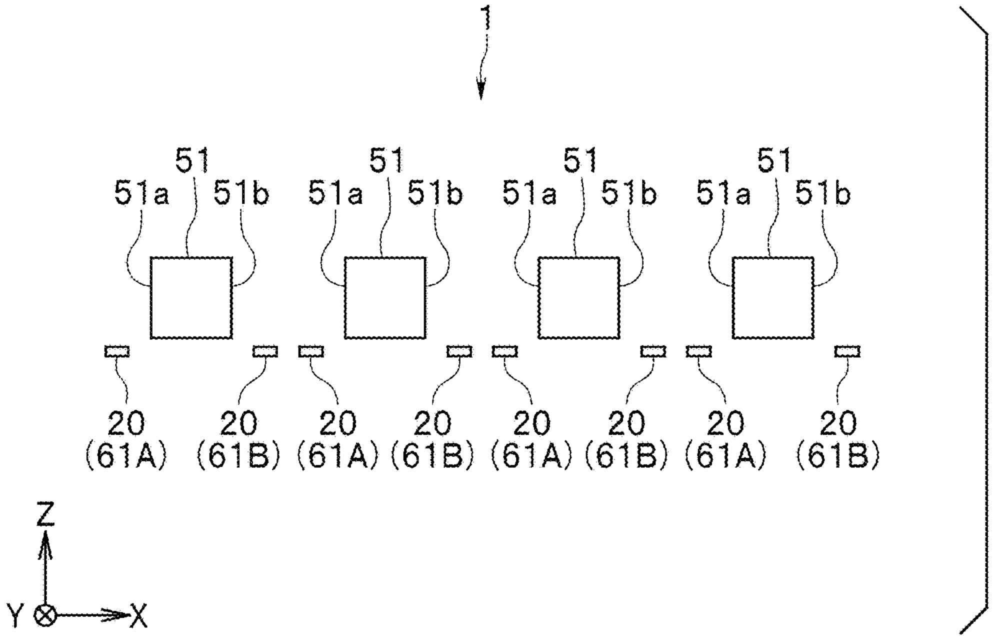
FIG. 4 is a side view showing a part of the magnetic sensor according to the first example embodiment of the technology.

Next, the configuration of the magnetic sensor 1 will be specifically described with reference to FIGS. 2 to 4. FIG. 2 is a perspective view showing a part of the magnetic sensor 1. FIG. 3 is a plan view showing a part of the magnetic sensor 1. FIG. 4 is a side view showing a part of the magnetic sensor 1.

Now, we define X, Y, and Z directions as shown in FIGS. 1 and 2. The X, Y, and Z directions are orthogonal to one another. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above". A direction parallel to the X direction corresponds to a "first direction" in the technology. A direction parallel to the Y direction corresponds to a "second direction" in the technology. A direction parallel to the Z direction corresponds to a "third direction" in the technology.

The magnetic sensor 1 further includes at least one yoke formed of a soft magnetic material. When seen in the direction parallel to the Z direction, e.g., from above, the at least one yoke has a long shape in the Y direction. The at least one yoke is also configured to generate an output magnetic field when an input magnetic field including an input magnetic field component in the direction parallel to the Z direction is applied thereto. The output magnetic field includes an output magnetic field component that is in the direction parallel to the X direction and varies depending on the input magnetic field component.

As shown in FIGS. 2 and 4, in the example embodiment in particular, the magnetic sensor 1 includes a plurality of yokes 51, disposed so that they are arranged in the X direction, as the at least one yoke. Each of the yokes 51 has a rectangular solid shape long in the Y direction, for example. The yokes 51 are identical in shape. Each of the yokes 51 has a first end face 51*a* and a second end face 51*b* located at both ends in the direction parallel to the X direction. The first end face 51*a* of each of the yokes 51 is located at the end in the −X direction, and the second end face 51*b* is located at the end in the X direction.

The magnetic sensor 1 further includes a plurality of structures disposed in the signal paths P1 to P4, and a plurality of first electrodes 81 and a plurality of second electrodes 82 connecting the plurality of structures in series. The plurality of first electrodes 81 and the plurality of second electrodes 82 are shown in FIGS. 6 to 9 to be described below. Each of the signal paths P1 to P4 includes at least one array. The at least one array includes an odd number of structures among the plurality of structures. The odd number of structures are disposed so that they are arranged in the direction parallel to the Y direction. At least one of the odd number of structures is a structure including an MR element 20.

In particular, in the example embodiment, each of the signal paths P1 to P4 includes a plurality of arrays. Each of the arrays includes five structures. Each of the five structures is a structure including an MR element 20.

A structure including an MR element 20 may be a structure including only one MR element 20, or a structure including two or more MR elements 20 electrically connected in parallel. In particular, in the following description, a structure including only one MR element 20 will also be referred to simply as an MR element 20.

Each of the signal paths P1 to P4 further includes two sub arrays. Each of the two sub arrays includes as many structures as the foregoing odd number of structures, i.e., five structures among the plurality of structures. The five structures are disposed so that they are arranged in the direction parallel to the Y direction. At least one of the five structures is a structure including an MR element 20. In particular, in the example embodiment, each of the five structures includes an MR element 20.

The plurality of arrays and the two sub arrays included in the signal path P1 constitute the resistor section R1. The plurality of arrays and the two sub arrays included in the signal path P2 constitute the resistor section R2. The plurality of arrays and the two sub arrays included in the signal path P3 constitute the resistor section R3. The plurality of arrays and the two sub arrays included in the signal path P4 constitute the resistor section R4.

The numbers of MR elements 20 included in the respective signal paths P1 to P4 are the same. The numbers of MR elements 20 included in the respective signal paths P1 to P4 may be an even number.

Two arrays 61A and 61B, disposed so that they are arranged in the direction parallel to the X direction, correspond to one yoke 51. The two arrays 61A and 61B corresponding to one yoke 51 are located near the end of the one yoke 51 in the −Z direction. The array 61A corresponding to the one yoke 51 is located near the first end face 51*a* of the yoke 51. The array 61B corresponding to the one yoke 51 is located near the second end face 51*b* of the yoke 51. The plurality of arrays 61A and the plurality of arrays 61B are disposed so that the arrays 61A and the arrays 61B are alternately arranged one by one in the direction parallel to the X direction.

The arrays 61A and 61B are included in respective different signal paths. Although not shown in the drawings, the magnetic sensor 1 includes a first area for laying out the resistor sections R1 and R4 and a second area for laying out the resistor sections R2 and R3. In the first area, the arrays included in the signal path P1 and those included in the signal path P4 correspond to the arrays 61A and 61B, respectively. In the second area, the arrays included in the signal path P2 and those included in the signal path P3 correspond to the arrays 61A and 61B, respectively. FIGS. 2 to 4 show a part of the first area or the second area.

In the first area or the second area, the array 61A located at the end in the X direction among the plurality of arrays 61A will be referred to a specific array 61A. The array 61B located at the end in the X direction among the plurality of arrays 61B will be referred to as a specific array 61B. The specific arrays 61A and 61B are also two arrays 61A and 61B corresponding to one yoke 51. When seen in the Z direction, the direction in which the current flows through the specific array 61A and the direction in which the current flows through the specific array 61B are the same. This description of the specific arrays 61A and 61B also applies to two arrays 61A and 61B corresponding to another yoke 51.

The magnetic sensor 1 may further include at least one shield formed of a soft magnetic material. When seen in the direction parallel to the Z direction, e.g., from above, the at least one shield is located to overlap with the plurality of yokes 51. When seen from above, the plurality of yokes 51 are located within the outer edges of the at least one shield.

In FIG. 3, the reference numeral 80 denotes a wiring portion composed of a plurality of first electrodes 81 and a plurality of second electrodes 82. Although not shown in the drawings, the magnetic sensor 1 further includes a sensor substrate and an insulating portion. The insulating portion is formed of an insulating material and covers the plurality of MR elements 20 and the wiring portions 80.

Figure 5:
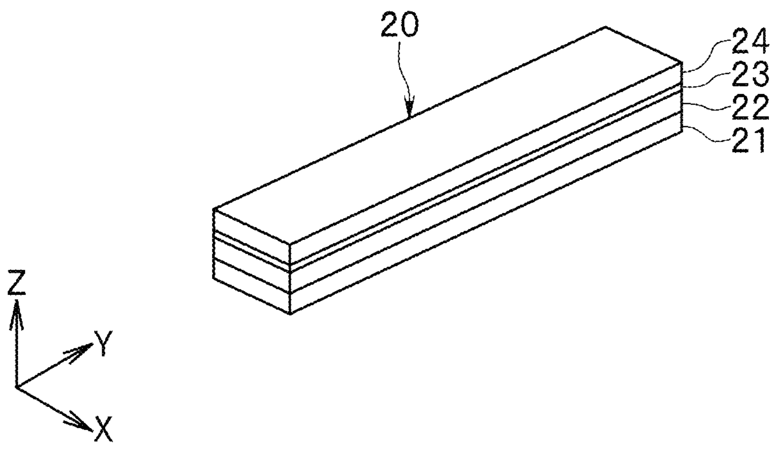
FIG. 5 is a perspective view showing a magnetoresistive element of the first example embodiment of the technology.

An example of a configuration of each MR element 20 will now be described with reference to FIG. 5. FIG. 5 is a perspective view of an MR element 20. In this example, the MR element 20 includes: a magnetization pinned layer 22 having a magnetization in a predetermined direction; a free layer 24 having a magnetization whose direction is variable depending on an applied magnetic field; a gap layer 23 disposed between the magnetization pinned layer 22 and the free layer 24; and an antiferromagnetic layer 21. The antiferromagnetic layer 21, the magnetization pinned layer 22, the gap layer 23, and the free layer 24 are stacked in this order. The antiferromagnetic layer 21 is formed of an antiferromagnetic material, and is in exchange coupling with the magnetization pinned layer 22 so as to fix a direction of the magnetization of the magnetization pinned layer 22.

The MR element 20 may be a tunneling magnetoresistive (TMR) element or a current-perpendicular-to-plane (CPP) giant magnetoresistive (GMR) element in which a sense current for use in magnetic signal detection is fed in a direction substantially perpendicular to the plane of the layers constituting the MR element 20. In the TMR element, the gap layer 23 is a tunnel barrier layer. In the GMR element, the gap layer 23 is a nonmagnetic conductive layer.

The MR element 20 varies in resistance value depending on an angle that a direction of the magnetization of the free layer 24 forms with respect to the direction of the magnetization of the magnetization pinned layer 22, and has a minimum resistance value when the foregoing angle is 0° and a maximum resistance value when the foregoing angle is 180°.

In the present example embodiment, the magnetization of the magnetization pinned layer 22 is in a direction parallel to the X direction. In the present example embodiment, the magnetizations of the magnetization pinned layers 22 of the MR elements 20 in the resistor section R1 are in the opposite direction to the magnetizations of the magnetization pinned layers 22 of the MR elements 20 in the resistor section R2. The magnetizations of the magnetization pinned layers 22 of the MR elements 20 in the resistor section R3 are in the same direction as the magnetizations of the magnetization pinned layers 22 of the MR elements 20 in the resistor section R2. The magnetizations of the magnetization pinned layers 22 of the MR elements 20 in the resistor section R4 are in the same direction as the magnetizations of the magnetization pinned layers 22 of the MR elements 20 in the resistor section R1.

In the present example embodiment, specifically, the magnetizations of the magnetization pinned layers 22 of the MR elements 20 in the resistor sections R1 and R4 are in the X direction. The magnetizations of the magnetization pinned layers 22 of the MR elements 20 in the resistor sections R2 and R3 are in the −X direction.

In the present example embodiment, each of the MR elements 20 is elongated in shape in a direction parallel to the Y direction. The free layer 24 of each of the MR elements 20 thus has shape anisotropy such that a direction of a magnetization easy axis is parallel to the Y direction. When there is no applied magnetic field, the direction of the magnetization of the free layer 24 is thus parallel to the Y direction. If there is an output magnetic field component in the direction parallel to the X direction, the direction of the magnetization of the free layer 24 varies depending on the direction and strength of the output magnetic field component. The angle that the direction of the magnetization of the free layer 24 forms with respect to the direction of the magnetization of the magnetization pinned layer 22 thus varies depending on the direction and strength of the output magnetic field component received by each of the MR elements 20. The resistance value of each of the MR elements 20 thus corresponds to the output magnetic field component. The directions of the magnetization easy axes can be set to the direction parallel to the Y direction regardless of the shape anisotropy by providing a magnet for applying a bias magnetic field to the free layers 24 of the MR elements 20.

In the present example embodiment, the direction of the output magnetic field component received by the MR elements 20 in the resistor section R2 is the same as the direction of the output magnetic field component received by the MR elements 20 in the resistor section R1. On the other hand, the direction of the output magnetic field component received by the MR elements 20 in the resistor section R3 and the direction of the output magnetic field component received by the MR elements 20 in the resistor section R4 are opposite to the direction of the output magnetic field component received by the MR elements 20 in the resistor section R1.

The magnetization pinned layer 22 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 22 is the self-pinned layer, the antiferromagnetic layer 21 may be omitted.

Next, the at least one detection signal generated by the magnetic sensor 1 will be described in detail with reference to FIG. 1. When there is no input magnetic field component and, as a result, no output magnetic field component, the direction of the magnetization of the free layer 24 of each MR element 20 is parallel to the Y direction. When there exists the input magnetic field component in the Z direction, the output magnetic field components received by the MR elements 20 in the resistor sections R1 and R2 are in the X direction, and the output magnetic field components received by the MR elements 20 in the resistor sections R3 and R4 are in the −X direction. In such a case, the direction of the magnetization of the free layers 24 of the MR elements 20 in the resistor sections R1 and R2 tilts toward the X direction from the direction parallel to the Y direction, and the direction of the magnetization of the free layers 24 of the MR elements 20 in the resistor sections R3 and R4 tilts toward the −X direction from the direction parallel to the Y direction. As a result, relative to the state where there is no output magnetic field component, the resistance values of the MR elements 20 in the resistor sections R1 and R3 decrease, and the resistance values of the resistor sections R1 and R3 also decrease. On the other hand, relative to the state where there is no output magnetic field component, the resistance values of the MR elements 20 in the resistor sections R2 and R4 increase, and the resistance values of the resistor sections R2 and R4 also increase.

When the input magnetic field component is in the −Z direction, the direction of the output magnetic field component and the changes in the resistance values of the resistor sections R1 to R4 become opposite from those in the above-described case where the input magnetic field component is in the Z direction.

The amount of change in the resistance value of each MR element 20 depends on the strength of the output magnetic field component received by the MR element 20. The resistance value of the MR element 20 increases or decreases by a larger amount as the strength of the output magnetic field component increases. The resistance value of the MR element 20 increases or decreases by a smaller amount as the strength of the output magnetic field component decreases. The strength of the output magnetic field component depends on the strength of the input magnetic field component.

As described above, changes in the direction and strength of the input magnetic field component cause the resistance values of the resistor sections R1 to R4 to change such that the resistance values of the resistor sections R1 and R3 increase while the resistance values of the resistor sections R2 and R4 decrease, or such that the resistance values of the resistor sections R1 and R3 decrease while the resistance values of the resistor sections R2 and R4 increase. This changes the potentials of the respective signal terminals E1 and E2 shown in FIG. 1. The magnetic sensor 1 generates two signals corresponding to the potentials of the signal terminals E1 and E2 or a signal corresponding to a potential difference between the signal terminals E1 and E2 as the at least one detection signal. The at least one detection signal varies depending on the angles that the directions of the magnetization of the free layers 24 form with respect to the directions of the magnetization of the magnetization pinned layers 22.

Figure 6:
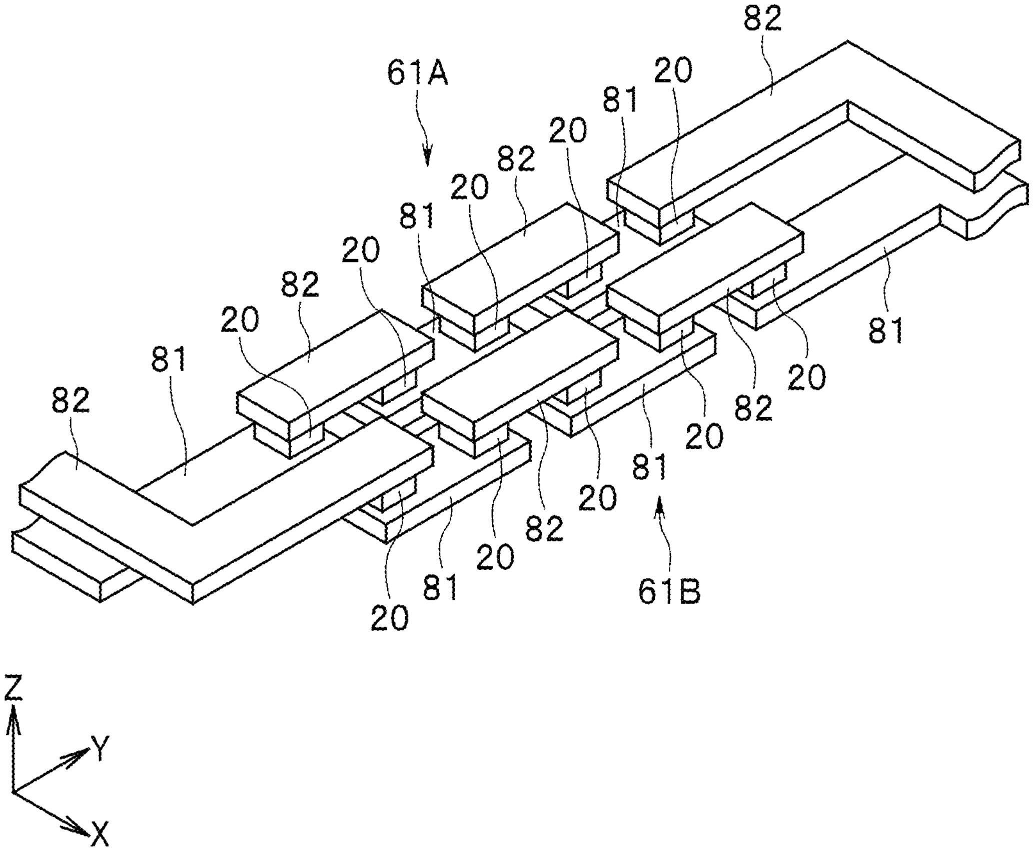
FIG. 6 is a perspective view showing a first array and a second array of the first example embodiment of the technology.
Figure 7:
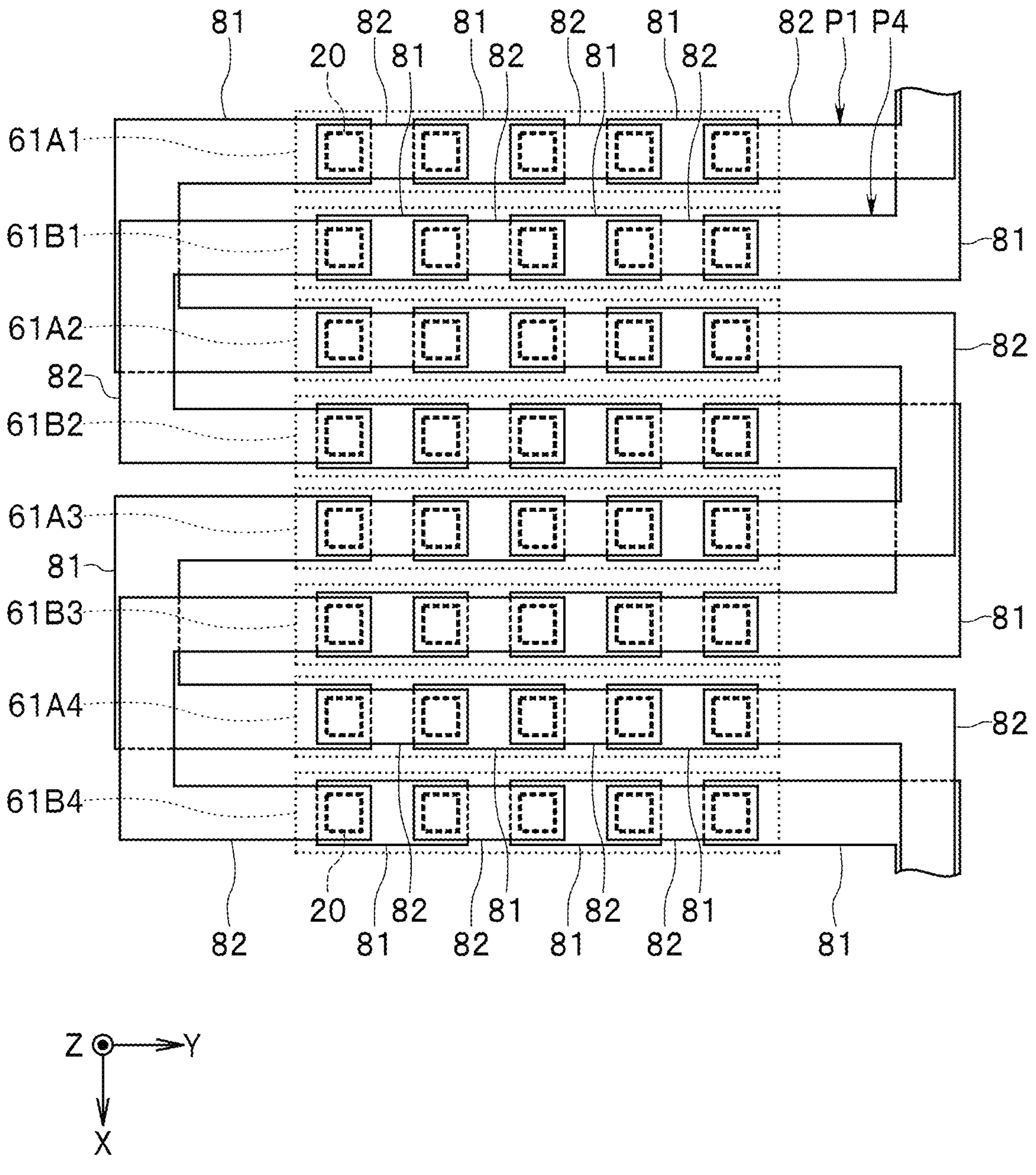
FIG. 7 is a plan view showing a plurality of first arrays and a plurality of second arrays of the first example embodiment of the technology.
Figure 8:
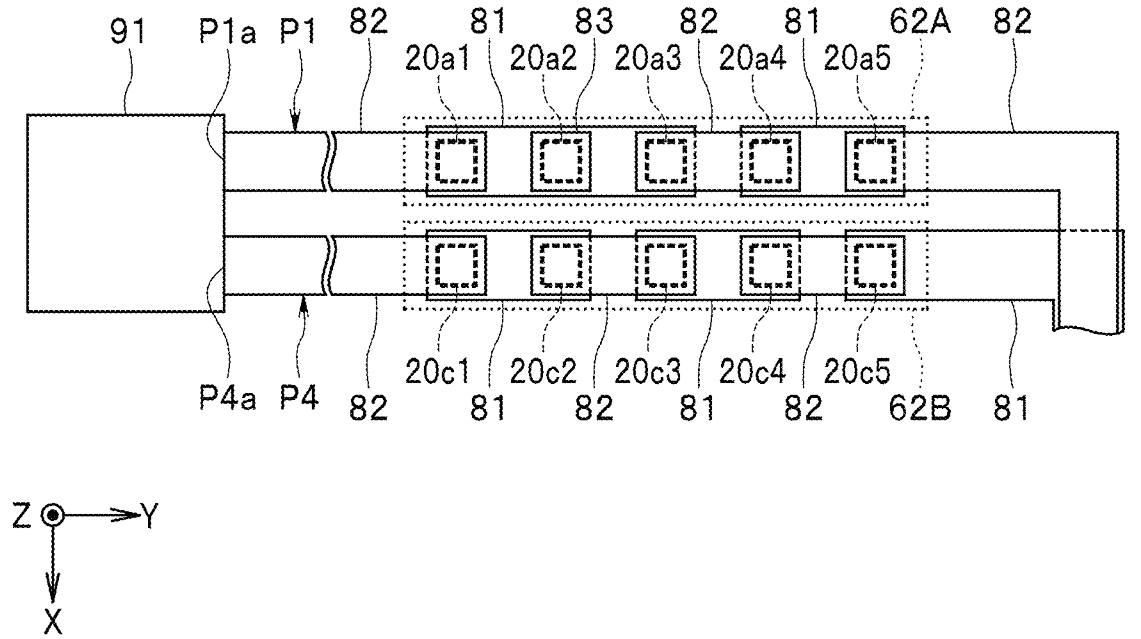
FIG. 8 is a plan view showing a first sub array and a third sub array of the first example embodiment of the technology.
Figure 9:
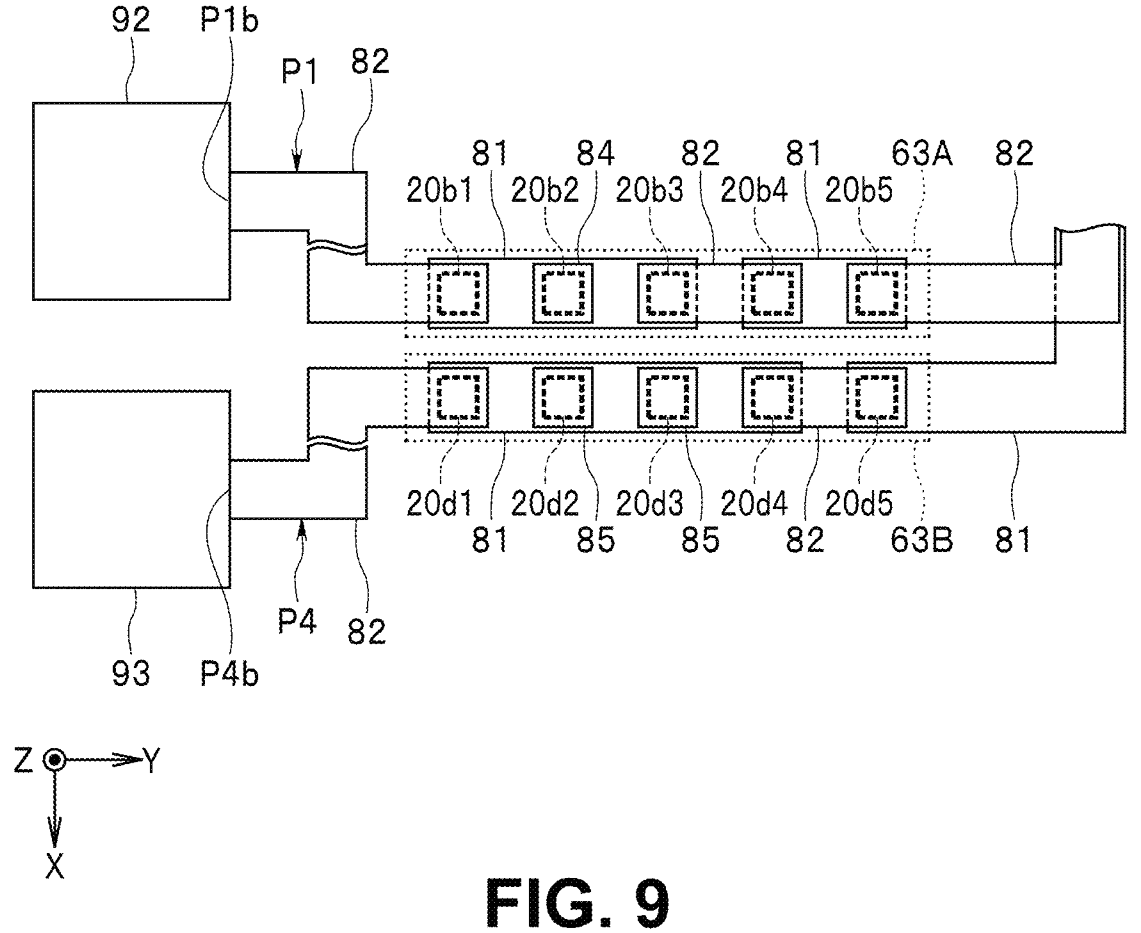
FIG. 9 is a plan view showing a second sub array and a fourth sub array of the first example embodiment of the technology.

Next, the plurality of first electrodes 81 and the plurality of second electrodes 82 in each array will be described with reference to FIGS. 6 to 9. FIG. 6 is a perspective view showing arrays 61A and 61B. FIG. 7 is a perspective view showing a plurality of arrays 61A and a plurality of arrays 61B. FIG. 8 is a plan view showing a first sub array and a third sub array. FIG. 9 is a plan view showing a second sub array and a fourth sub array. In FIGS. 6 to 9, the MR elements 20 are shown in a simplified form for the sake of convenience. In similar diagrams used in the following description to FIGS. 7 to 9, the MR elements 20 are also shown in a simplified form.

A description will be given below by using the signal paths P1 and P4 as an example. In the following description, the signal path P1 will also be referred to as a first path P1, and the signal path P4 as a second path P4. The plurality of arrays 61A will also be referred to as a plurality of first arrays 61A, and the plurality of arrays 61B as a plurality of second arrays 61B.

The plurality of first electrodes 81 and the plurality of second electrodes 82 are located at different positions in the direction parallel to the Z direction. In each of the first and second paths P1 and P4, a plurality of structures, i.e., a plurality of MR elements 20 are disposed on the plurality of first electrodes 81. The plurality of second electrodes 82 are disposed on the plurality of MR elements 20.

In each of the first arrays 61A and the second arrays 61B, five MR elements 20, a plurality of first electrodes 81, and a plurality of second electrodes 82 are connected in the following relationship. Each of the first electrodes 81 has a long shape in the direction parallel to the Y direction. Two first electrodes 81 adjoining in the direction parallel to the Y direction have a gap therebetween. The MR elements 20 are located on the top surfaces of the first electrodes 81, near one end or both ends in the direction parallel to the Y direction. Each of the second electrodes 82 electrically connects two adjoining MR elements 20 disposed on two first electrodes 81 adjoining in the direction parallel to the Y direction. The plurality of MR elements 20 are thereby connected in series. In each of the first and second arrays 61A and 61B, the plurality of first electrodes 81 and the plurality of second electrodes 82 are provided so that the first electrodes 81 and the second electrodes 82 are alternately arranged one by one in the current-flowing direction.

Each MR element 20 has a first surface and a second surface located at both ends in the direction parallel to the Z direction. The first surface of the MR element 20 is connected to one of the first electrodes 81. The second surface of the MR element 20 is connected to one of the second electrodes 82.

FIG. 7 shows four first arrays 61A and four second arrays 61B among the plurality of first arrays 61A and the plurality of second arrays 61B. For the sake of convenience, FIG. 7 shows the four first arrays 61A with the reference numerals 61A1, 61A2, 61A3, and 61A4 in order along the X direction. Similarly, for the sake of convenience, FIG. 7 shows the four second arrays 61B with the reference numerals 61B1, 61B2, 61B3, and 61B4 in order along the X direction.

A second electrode 82 led in from outside the first array 61A1 is connected to the MR element 20 located at the end of the first array 61A1 in the Y direction. The two MR elements 20 located at the ends of the respective first arrays 61A1 and 61A2 in the −Y direction are connected to each other by a first electrode 81. The two MR elements 20 located at the ends of the respective first arrays 61A2 and 61A3 in the Y direction are connected to each other by a second electrode 82. The two MR elements 20 located at the ends of the respective first arrays 61A3 and 61A4 in the −Y direction are connected to each other by a first electrode 81. A second electrode 82 led out from the first array 61A4 is connected to the MR element 20 located at the end of the first array 61A4 in the Y direction. In each of the first arrays 61A1 to 61A4, both the number of first electrodes 81 and the number of second electrodes 82 connected to the five MR elements 20 are three.

A first electrode 81 led in from outside the second array 61B1 is connected to the MR element 20 located at the end of the second array 61B1 in the Y direction. The two MR elements 20 located at the ends of the respective second arrays 61B1 and 61B2 in the −Y direction are connected to each other by a second electrode 82. The two MR elements 20 located at the ends of the respective second arrays 61B2 and 61B3 in the Y direction are connected to each other by a first electrode 81. The two MR elements 20 located at the ends of the respective second arrays 61B3 and 61B4 in the −Y direction are connected to each other by a second electrode 82. A first electrode 81 led out from the second array 61B4 is connected to the MR element 20 located at the end of the second array 61B4 in the Y direction. In each of the second arrays 61B1 to 61B4, both the number of first electrodes 81 and the number of second electrodes 82 connected to the five MR elements 20 are three.

The first path P1 includes a first sub array 62A and a second sub array 63A as the two sub arrays. The first sub array 62A is disposed in the first path P1 between one end P1*a* of the first path P1 and the plurality of first arrays 61A. The second sub array 63A is disposed in the first path P1 between the other end P1*b* of the first path P1 and the plurality of first arrays 61A. The one end P1*a* of the first path P1 may be the end of the first path P1 on the side of the power supply terminal V1, for example. The other end P1*b* of the first path P1 may be the end of the first path P1 on the side of the signal terminal E1, for example.

The second path P4 includes a third sub array 62B and a fourth sub array 63B as the two sub arrays. The third sub array 62B is disposed in the second path P4 between one end P4*a* of the second path P4 and the plurality of second arrays 61B. The fourth sub array 63B is disposed in the second path P4 between the other end P4*b* of the second path P4 and the plurality of second arrays 61B. The one end P4*a* of the second path P4 may be the end of the second path P4 on the side of the power supply terminal V1, for example. The other end P4*b* of the second path P4 may be the end of the second path P4 on the side of the signal terminal E2, for example.

For the sake of convenience, FIG. 8 shows the five MR elements 20 in the first sub array 62A with the reference numerals 20*a*1, 20*a*2, 20*a*3, 20*a*4, and 20*a*5 in order along the Y direction. Similarly, for the sake of convenience, FIG. 8 shows the five MR elements 20 in the third sub array 62B with the reference numerals 20*c*1, 20*c*2, 20*c*3, 20*c*4, and 20*c*5 in order along the Y direction. The MR element 20*al* is the structure closest to the one end P1*a* of the first path P1 in the first path P1, included in the first sub array 62A. The MR element 20*cl* is the structure closest to the one end P4*a* of the second path P4 in the second path P4, included in the third sub array 62B.

The first sub array 62A and the one end P1*a* of the first path P1, and the third sub array 62B and the one end P4*a* of the second path P4, are both connected by a second electrode 82. More specifically, the MR element 20*al* and the one end P1*a* of the first path P1 are connected by a second electrode 82. The MR element 20*cl* and the one end P4*a* of the second path P4 are connected by a second electrode 82.

In the example shown in FIG. 8, a second electrode 82 led in from outside the first sub array 62A is connected to the MR element 20*a*5. The MR elements 20*a*4 and 20*a*5 are connected by a first electrode 81. The MR elements 20*a*3 and 20*a*4 are connected by a second electrode 82. The MR elements 20*a*1, 20*a*2, and 20*a*3 are connected by a first electrode 81.

The second surface of the MR element 20*a*2 is not electrically connected to the second surface of any other MR element 20. No current therefore flows in the direction perpendicular to the surfaces of the layers constituting the MR element 20*a*2. Note that an electrode 83 not electrically connected to any other MR element 20 may be connected to the second surface of the MR element 20*a*2. The plurality of second electrodes 82 and the electrode 83 are located at the same position in the direction parallel to the Z direction.

In the example shown in FIG. 8, a first electrode 81 led in from outside the third sub array 62B is connected to the MR element 20*c*5. The MR elements 20*c*4 and 20*c*5 are connected by a second electrode 82. The MR elements 20*c*3 and 20*c*4 are connected by a first electrode 81. The MR elements 20*c*2 and 20*c*3 are connected by a second electrode 82. The MR elements 20*c*1 and 20*c*2 are connected by a first electrode 81.

The one end P1*a* of the first path P1 and the one end P4*a* of the second path P4 may be connected to an electrode pad 91. The electrode pad 91 may be an electrode pad constituting the power supply terminal V1, for example.

For the sake of convenience, FIG. 9 shows the five MR elements 20 in the second sub array 63A with the reference numerals 20*b*1, 20*b*2, 20*b*3, 20*b*4, and 20*b*5 in order along the Y direction. Similarly, for the sake of convenience, FIG. 9 shows the five MR elements 20 in the fourth sub arrays 63B with the reference numerals 20*d*1, 20*d*2, 20*d*3, 20*d*4, and 20*d*5 in order along the Y direction. The MR element 20*b*1 is the structure closest to the other end P1*b* of the first path P1 in the first path P1, included in the second sub array 63A. The MR element 20*d*1 is the structure closest to the other end P4*b* of the second path P4 in the second path P4, included in the fourth sub array 63B.

The second sub array 63A and the other end P1*b* of the first path P1, and the fourth sub array 63B and the other end P4*b* of the second path P4, are both connected by a second electrode 82. More specifically, the MR element 20*b*1 and the other end P1*b* of the first path P1 are connected by a second electrode 82. The MR element 20*dl* and the other end P4*b* of the second path P4 are connected by a second electrode 82.

In the example shown in FIG. 9, a second electrode 82 led in from outside the second sub array 63A is connected to the MR element 20*b*5. The MR elements 20*b*4 and 20*b*5 are connected by a first electrode 81. The MR elements 20*b*3 and 20*b*4 are connected by a second electrode 82. The MR elements 20*b*1, 20*b*2, and 20*b*3 are connected by a first electrode 81.

The second surface of the MR element 20*b*2 is not electrically connected to the second surface of any other MR element 20. The current flowing through the first path P1 therefore does not pass through the layers constituting the MR element 20*b*2. The MR element 20*b*2 therefore does not function. Note that an electrode 84 not electrically connected to any other MR element 20 may be connected to the second surface of the MR element 20*b*2. The plurality of second electrodes 82 and the electrode 84 are located at the same position in the direction parallel to the Z direction.

In the example shown in FIG. 9, a first electrode 81 led in from outside the fourth sub array 63B is connected to the MR element 20*d*5. The MR elements 20*d*4 and 20*d*5 are connected by a second electrode 82. The MR elements 20*d*1, 20*d*2, 20*d*3, and 20*d*4 are connected by a first electrode 81.

The second surface of each of the MR elements 20*d*2 and 20*d*3 is not electrically connected to the second surface of any other MR element 20. The current flowing through the second path P4 therefore does not pass through the layers constituting the MR element 20*d*2 or the layers constituting the MR element 20*d*3. The MR elements 20*d*2 and 20*d*3 therefore do not function. Note that an electrode 85 not electrically connected to any other MR element 20 may be connected to the second surface of each of the MR elements 20*d*2 and 20*d*3. The plurality of second electrodes 82 and the two electrodes 85 are located at the same position in the direction parallel to the Z direction.

The other end P1*b* of the first path P1 may be connected to an electrode pad 92. The other end P4*b* of the second path P4 may be connected to an electrode pad 93. The electrode pad 92 may be an electrode pad constituting the signal terminal E1, for example. The electrode pad 93 may be an electrode pad constituting the signal terminal E2, for example. The electrode pads 91 to 93 may be located at the same position in the direction parallel to the Z direction. Although not shown in the drawings, an electrode pad constituting the ground terminal G1 may be located at the same position as that of the electrode pads 91 to 93 in the direction parallel to the Z direction.

Up to this point, the description has been given by using the signal paths P1 and P4 as an example. The foregoing description of the signal paths P1 and P4 also applies to the signal paths P2 and P3. A description of the signal paths P2 and P3 is given by replacing the signal paths P1 and P4 and the power supply terminal V1 in the foregoing description with the signal paths P2 and P3 and the ground terminal G1, respectively.

Next, the operation and effects of the magnetic sensor 1 according to the example embodiment will be described. In the example embodiment, as described above, the two MR elements 20 located at the ends of the respective first arrays 61A1 and 61A2 in the −Y direction are connected to each other by a first electrode 81. The two MR elements 20 located at the ends of the respective second arrays 61B1 and 61B2 in the −Y direction are connected to each other by a second electrode 82. The two MR elements 20 located at the ends of the respective first arrays 61A2 and 61A3 in the Y direction are connected to each other by a second electrode 82. The two MR elements 20 located at the ends of the respective second arrays 61B2 and 61B3 in the Y direction are connected to each other by a first electrode 81.

Focus attention on the first array 61A2 and the second array 61B2. As shown in FIG. 7, the electrode led out from the first array 61A2 in the −Y direction to be connected to the first array 61A1 is a first electrode 81. The electrode led out from the second array 61B2 in the −Y direction to be connected to the second array 61B1 is a second electrode 82. Moreover, as shown in FIG. 7, the electrode led out from the first array 61A2 in the Y direction to be connected to the first array 61A3 is a second electrode 82. The electrode led out from the second array 61B2 in the Y direction to be connected to the second array 61B3 is a first electrode 81. In the example embodiment, different types of electrodes are thus led out from the first and second arrays 61A and 61B in the same direction. According to the example embodiment, the electrodes led out from the first and second arrays 61A and 62B in the same direction can thus intersect each other. As a result, according to the example embodiment, both the first arrays 61A and the second arrays 61B can be connected at every other row. Moreover, in the example embodiment, both the first arrays 61A and the second arrays 61B can be connected at every other row without needing a connection structure configured to connect a first electrode 81 and a second electrode 82, specifically, a connection electrode or a via hole.

In the example embodiment, each of the first and second arrays 61A and 61B includes an odd number of structures, or five MR elements 20, as described above. Suppose now that the first array 61A2 and the second array 61B2 shown in FIG. 7 each include four MR elements 20 as an even number of structures. In such a case, to lead out different types of electrodes in the same direction from the first array 61A2 and the second array 61B2 as described above makes the number of first electrodes 81 and the number of second electrodes 82 different between the first array 61A2 and the second array 61B2.

For example, if the first array 61A2 shown in FIG. 7 includes four MR elements 20 from the end in the −Y direction, the number of first electrodes 81 and the number of second electrodes 82 included in the first array 61A2 are three and two, respectively. On the other hand, if the second array 61B2 shown in FIG. 7 includes four MR elements 20 from the end in the −Y direction, the number of first electrodes 81 and the number of second electrodes 82 included in the second array 61B2 are two and three, respectively.

The first array 61A2 is thus affected by variations in the shape and the like of the plurality of first electrodes 81 more greatly than the second array 61B2. Meanwhile, the second array 61B2 is affected by variations in the shape and the like of the plurality of second electrodes 82 more greatly than the first array 61A2.

In contrast, in the example embodiment, both the number of first electrodes 81 and the number of second electrodes 82 included in the first array 61A are three. Both the number of first electrodes 81 and the number of second electrodes 82 included in the second array 61B are also three. According to the example embodiment, the inclusion of an odd number (five) of structures, i.e., MR elements 20 in each of the first and second arrays 61A and 61B can make the number of first electrodes 81 and the number of second electrodes 82 included in each of the first and second arrays 61A and 61B the same. As a result, according to the example embodiment, variations in the characteristics between the first arrays 61A and the second arrays 61B can be reduced.

In the example embodiment, the plurality of first arrays 61A in the signal path P1 constitute a main portion of the resistor section R1. The plurality of first arrays 61A in the signal path P2 constitute a main portion of the resistor section R2. The plurality of second arrays 61B in the signal path P3 constitute a main portion of the resistor section R3. The plurality of second arrays 61B in the signal path P4 constitute a main portion of the resistor section R4. In the example embodiment, the number of first electrodes 81 included in the plurality of first arrays 61A, the number of second electrodes 82 included in the plurality of first arrays 61A, the number of first electrodes 81 included in the plurality of second arrays 61B, and the number of second electrodes 82 included in the plurality of second arrays 61B are the same. According to the example embodiment, variations in the characteristics between the resistor sections R1 to R4 can thereby be reduced.

In the example embodiment, as described above, the number of first electrodes 81 and the number of second electrodes 82 included in each of the first and second arrays 61A and 61B are made the same while connecting the first arrays 61A and the second arrays 61B at every other row. In the example embodiment, the plurality of first electrodes 81 and the plurality of second electrodes 82 are thereby disposed so that the first electrodes 81 and the second electrodes 82 are alternately arranged one by one in the direction parallel to the X direction.

Moreover, the example embodiment includes the first to fourth sub arrays 62A, 62B, 63A, and 63B. According to the example embodiment, all the electrodes led out from the respective resistor sections R1 to R4 can thereby be configured as second electrodes 82. Note that the first to fourth sub arrays 62A, 62B, 63A, and 63B are not indispensable components of the magnetic sensor 1, and may be omitted. Alternatively, instead of the first to fourth sub arrays 62A, 62B, 63A, and 63B, connection structures configured to connect the first electrodes 81 and the second electrodes 82 may be provided. The connection structures may be connection electrodes formed of a nonmagnetic metal such as Ta, interposed between the first electrodes 81 and the second electrodes 82. The connection structures may be via holes for making the second electrodes 82 contact the first electrodes 81.

Second Example Embodiment

Figure 10:
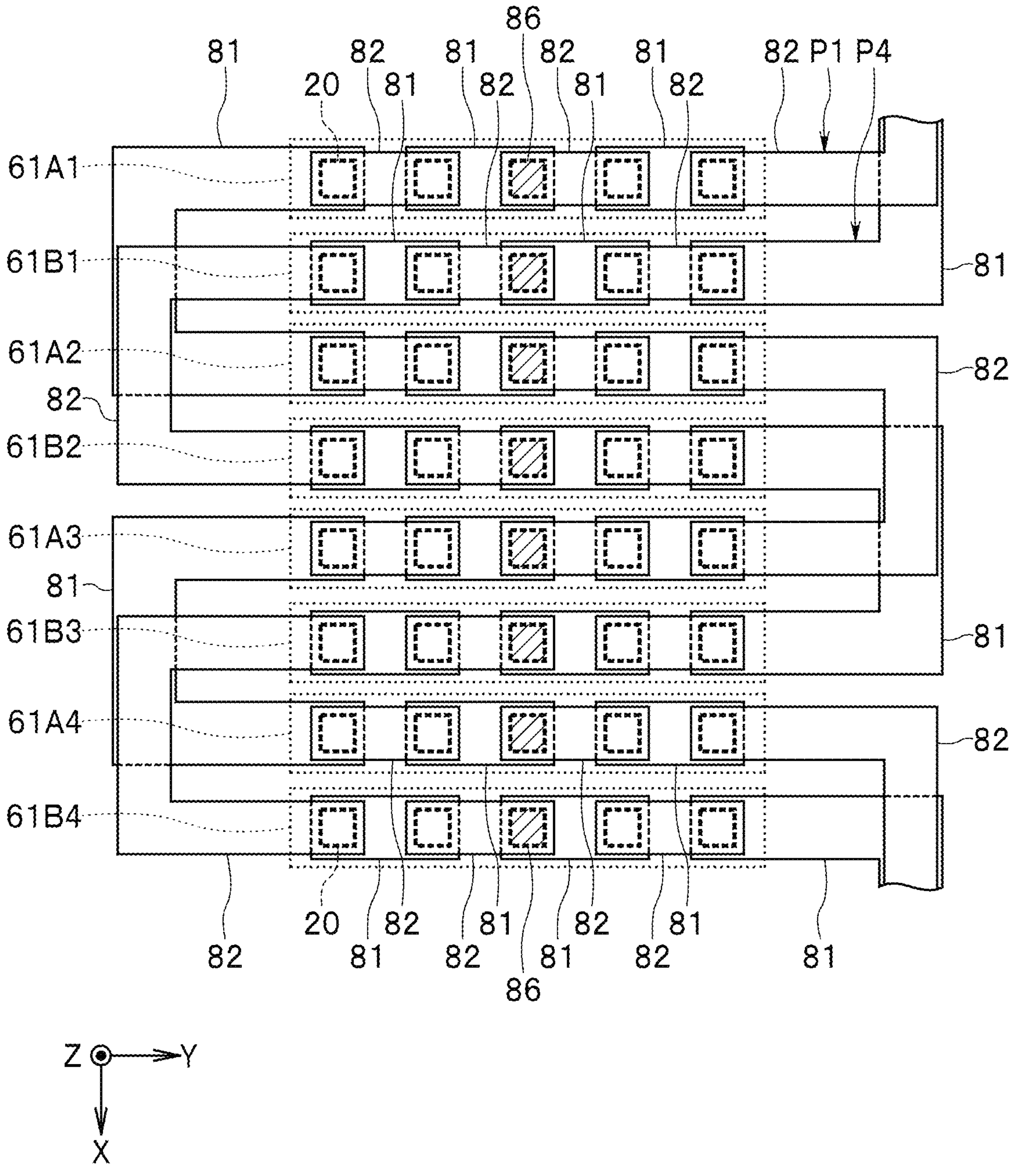
FIG. 10 is a plan view showing a plurality of first arrays and a plurality of second arrays of a second example embodiment of the technology.

A second example embodiment of the technology will now be described with reference to FIG. 10. FIG. 10 is a plan view showing a plurality of first arrays 61A and a plurality of second arrays 61B.

In the example embodiment, at least one of an odd number of structures in each of the first and second arrays 61A and 61B is a connection structure for connecting one of first electrodes 81 and one of second electrodes 82, and more specifically a connection electrode formed of a nonmagnetic metal such as Ta. In particular, in the example embodiment, each of the first and second arrays 61A and 61B includes four MR elements 20 and a connection electrode 86 as the five structures. For ease of understanding, the connection electrodes 86 are shown hatched in FIG. 10.

In the example shown in FIG. 10, in each of the first and second arrays 61A and 61B, the structure located at the center of the five structures in the direction parallel to the Y direction is the connection electrode 86. However, the position and numbers of connection electrodes 86 are not limited to the example shown in FIG. 10. For example, the number of connection electrodes 86 may be more than one. As the connection structure, a via hole for making the second electrode 82 contact the first electrode 81 may be provided instead of or in addition to the connection electrode 86.

The configuration, operation and effects of the present example embodiment are otherwise the same as those of the first example embodiment.

Third Example Embodiment

Figure 11:
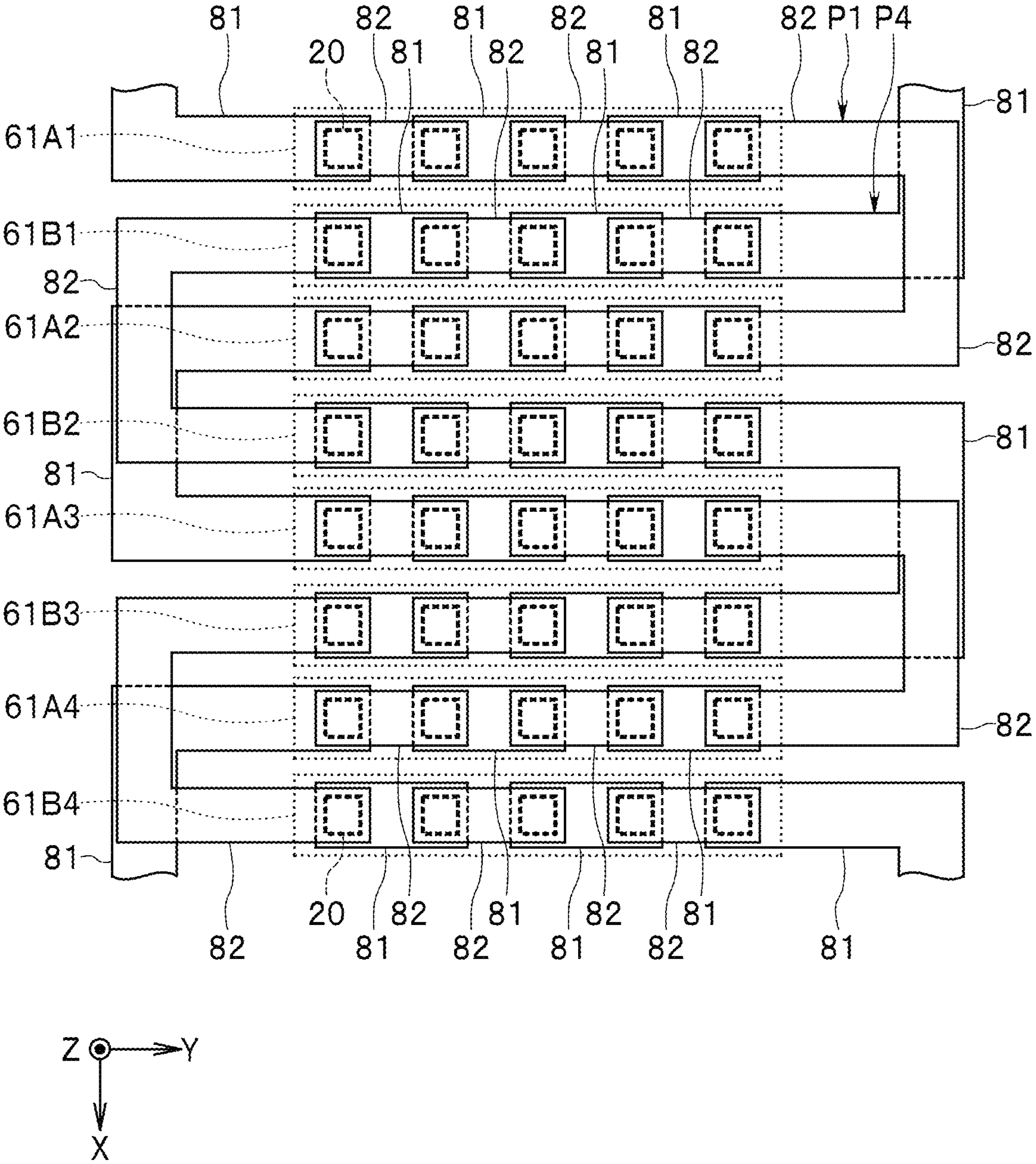
FIG. 11 is a plan view showing a plurality of first arrays and a plurality of second arrays of a third example embodiment of the technology.

A third example embodiment of the technology will now be described with reference to FIG. 11. FIG. 11 is a plan view showing a plurality of first arrays 61A and a plurality of second arrays 61B.

As described in the first example embodiment, the array 61A located at the end in the X direction among the plurality of arrays 61A will be referred to as a specific array 61A. The array 61B located at the end in the X direction among the plurality of arrays 61B will be referred to as a specific array 61B. The specific arrays 61A and 61B are also two arrays 61A and 61B corresponding to one yoke 51 (see FIGS. 2 to 4). In the example embodiment, when seen in the Z direction, the direction in which the current flows through the specific array 61A and the direction in which the current flows through the specific array 61B are opposite to each other.

For the sake of convenience, FIG. 11, like FIG. 7 of the first example embodiment, shows the four first arrays 61A with the reference numerals 61A1, 61A2, 61A3, and 61A4 in order along the X direction. Similarly, for the sake of convenience, FIG. 11 shows the four second arrays 61B with the reference numerals 61B1, 61B2, 61B3, and 61B4 in order along the X direction.

A first electrode 81 led in from outside the first array 61A1 is connected to the MR element 20 located at the end of the first array 61A1 in the −Y direction. The two MR elements 20 located at the ends of the respective first arrays 61A1 and 61A2 in the Y direction are connected to each other by a second electrode 82. The two MR elements 20 located at the ends of the respective first arrays 61A2 and 61A3 in the −Y direction are connected to each other by a first electrode 81. The two MR elements 20 located at the ends of the respective first arrays 61A3 and 61A4 in the Y direction are connected to each other by a second electrode 82. A first electrode 81 led out from the first array 61A4 is connected to the MR element 20 located at the end of the first array 61A4 in the −Y direction.

A first electrode 81 led in from outside the second array 61B1 is connected to the MR element 20 located at the end of the second array 61B1 in the Y direction. The two MR elements 20 located at the ends of the respective second arrays 61B1 and 61B2 in the −Y direction are connected to each other by a second electrode 82. The two MR elements 20 located at the ends of the respective second arrays 61B2 and 61B3 in the Y direction are connected to each other by a first electrode 81. The two MR elements 20 located at the ends of the respective second arrays 61B3 and 61B4 in the −Y direction are connected to each other by a second electrode 82. A first electrode 81 led out from the second array 61B4 is connected to the MR element 20 located at the end of the second array 61B4 in the Y direction.

In the example embodiment, a magnetic field generated by the current flowing through the first array 61A1 and a magnetic field generated by the current flowing through the second array 61B1 cancel each other in the one yoke 51 corresponding to the first array 61A1 and the second array 61B1. According to the example embodiment, the effect of the foregoing magnetic fields on the output magnetic field component generated by the one yoke 51 can be reduced.

The foregoing description of the pair of first and second arrays 61A1 and 61B1 also applies to the pair of first and second arrays 61A2 and 61B2, the pair of first and second arrays 61A3 and 61B3, and the pair of first and second arrays 61A4 and 61B4.

In the example embodiment, the electrode led into the first array 61A1 from outside, the electrode led out from the first array 61A4, the electrode led into the second array 61B1 from outside, and the electrode led out from the second array 61B4 are all first electrodes 81. According to the example embodiment, all the electrodes led out from the respective resistor sections R1 to R4 can thus be configured as first electrodes 81 without providing the first to fourth sub arrays 62A, 62B, 63A, and 63B according to the first example embodiment. Note that the electrode led into the first array 61A1 from outside, the electrode led out from the first array 61A4, the electrode led into the second array 61B1 from outside, and the electrode led out from the second array 61B4 may all be second electrodes 82.

The configuration, operation and effects of the present example embodiment are otherwise the same as those of the first example embodiment.

Fourth Example Embodiment

A fourth example embodiment of the technology will now be described. In the fourth example embodiment, a magnetic sensor 1 is configured to detect a partial magnetic field whose direction varies within a YZ plane as a target magnetic field.

Figure 12:
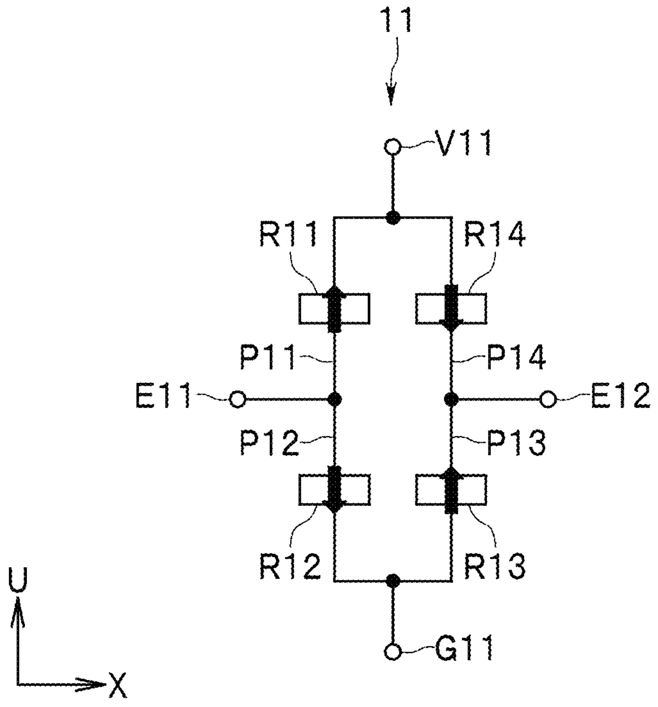
FIG. 12 is a circuit diagram showing a circuit configuration of a first detection circuit of a magnetic sensor according to a fourth example embodiment of the technology.
Figure 13:
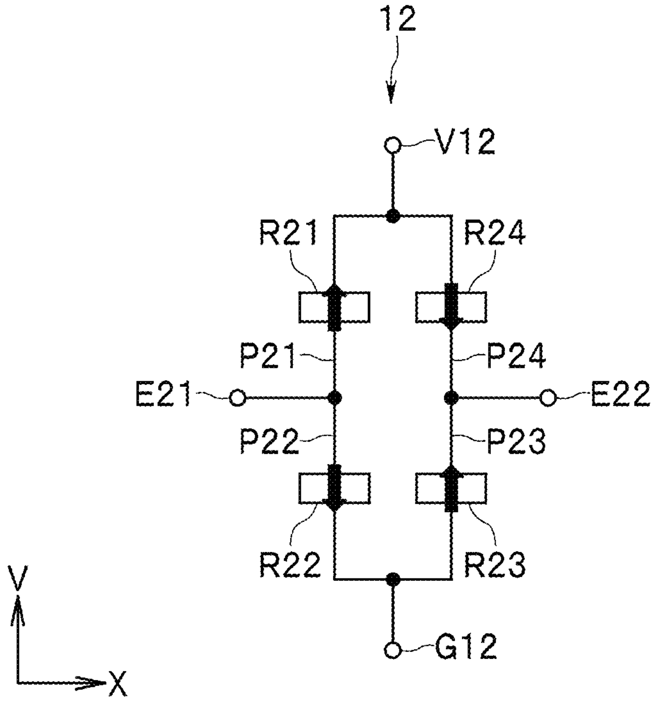
FIG. 13 is a circuit diagram showing a circuit configuration of a second detection circuit of the magnetic sensor according to the fourth example embodiment of the technology.

A schematic configuration of the magnetic sensor 1 according to the example embodiment will be described below with reference to FIGS. 12 and 13. FIG. 12 is a circuit diagram showing a circuit configuration of a first detection circuit of the magnetic sensor 1. FIG. 13 is a circuit diagram showing a circuit configuration of a second detection circuit of the magnetic sensor 1.

The magnetic sensor 1 according to the example embodiment includes a first power supply terminal, a second power supply terminal, one or two first signal terminals, one or two second signal terminals, one or two first signal paths connecting the first power supply terminal and the one or two first signal terminals, one or two second signal paths connecting the one or two first signal terminals and a ground, one or two third signal paths connecting the second power supply terminal and the one or two second signal terminals, and one or two fourth signal paths connecting the one or two second signal terminals and the ground. The magnetic sensor 1 further includes a first ground terminal and a second ground terminal.

In particular, in the example embodiment, the magnetic sensor 1 includes a first detection circuit 11 and a second detection circuit 12. As shown in FIG. 12, the first detection circuit 11 includes a power supply terminal V11, a ground terminal G11, two signal terminals E11 and E12, a signal path P11 connecting the power supply terminal V11 and the signal terminal E11, a signal path P14 connecting the power supply terminal V11 and the signal terminal E12, a signal path P12 connecting the signal terminal E11 and the ground terminal G11, and a signal path P13 connecting the signal terminal E12 and the ground terminal G11 as the first power supply terminal, the first ground terminal, the first signal terminals, the first signal paths, and the second signal paths. A power supply voltage of predetermined magnitude is applied to the power supply terminal V11. The ground terminal G11 is grounded. A current flows through each of the signal paths P11 to P14.

The first detection circuit 11 further includes a resistor section R11 disposed in the signal path P11, a resistor section R12 disposed in the signal path P12, a resistor section R13 disposed in the signal path P13, and a resistor section R14 disposed in the signal path P14. Each of the resistor sections R11 to R14 includes a plurality of MR elements 20.

The first detection circuit 11 generates two signals corresponding to the potentials of the signal terminals E11 and E12 or a signal corresponding to a potential difference between the signal terminals E11 and E12 as at least one first detection signal.

As shown in FIG. 13, the second detection circuit 12 includes a power supply terminal V12, a ground terminal G12, two signal terminals E21 and E22, a signal path P21 connecting the power supply terminal V12 and the signal terminal E21, a signal path P24 connecting the power supply terminal V12 and the signal terminal E22, a signal path P22 connecting the signal terminal E21 and the ground terminal G12, and a signal path P23 connecting the signal terminal E22 and the ground terminal G12 as the second power supply terminal, the second ground terminal, the second signal terminals, the third signal paths, and the fourth signal paths. A power supply voltage of predetermined magnitude is applied to the power supply terminal V12. The ground terminal G12 is grounded. A current flows through each of the signal paths P21 to P24.

The second detection circuit 12 further includes a resistor section R21 disposed in the signal path P21, a resistor section R22 disposed in the signal path P22, a resistor section R23 disposed in the signal path P23, and a resistor section R24 disposed in the signal path P24. Each of the resistor sections R21 to R24 includes a plurality of MR elements 20.

The second detection circuit 12 generates two signals corresponding to the potentials of the signal terminals E21 and E22 or a signal corresponding to a potential difference between the signal terminals E21 and E22 as at least one second detection signal.

Figure 14:
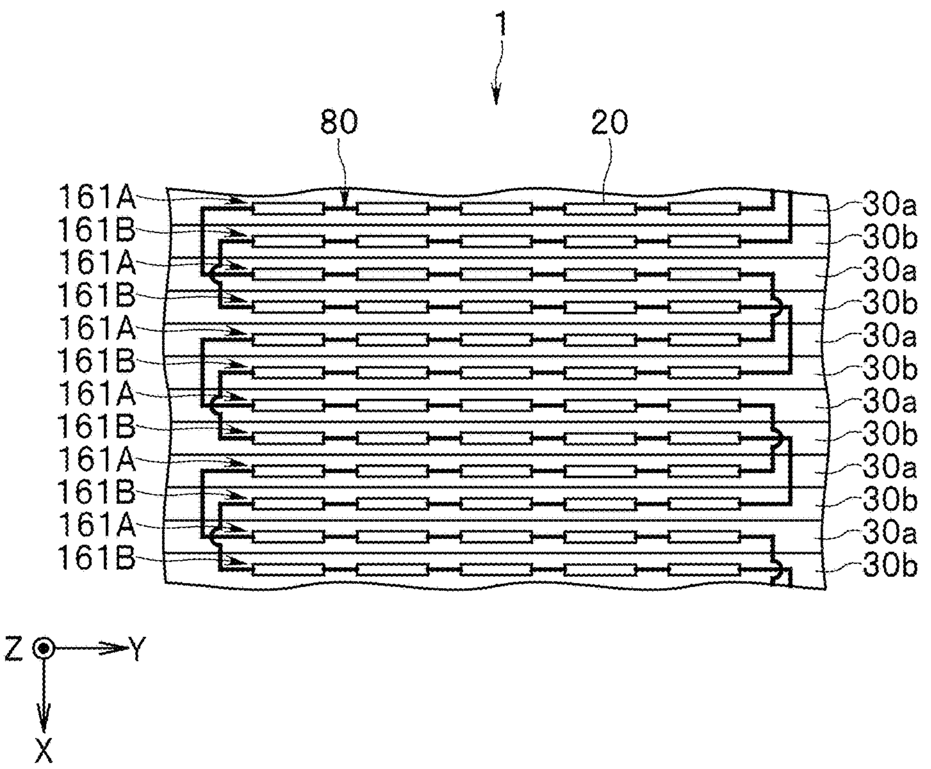
FIG. 14 is a plan view showing a part of the magnetic sensor according to the fourth example embodiment of the technology.
Figure 15:
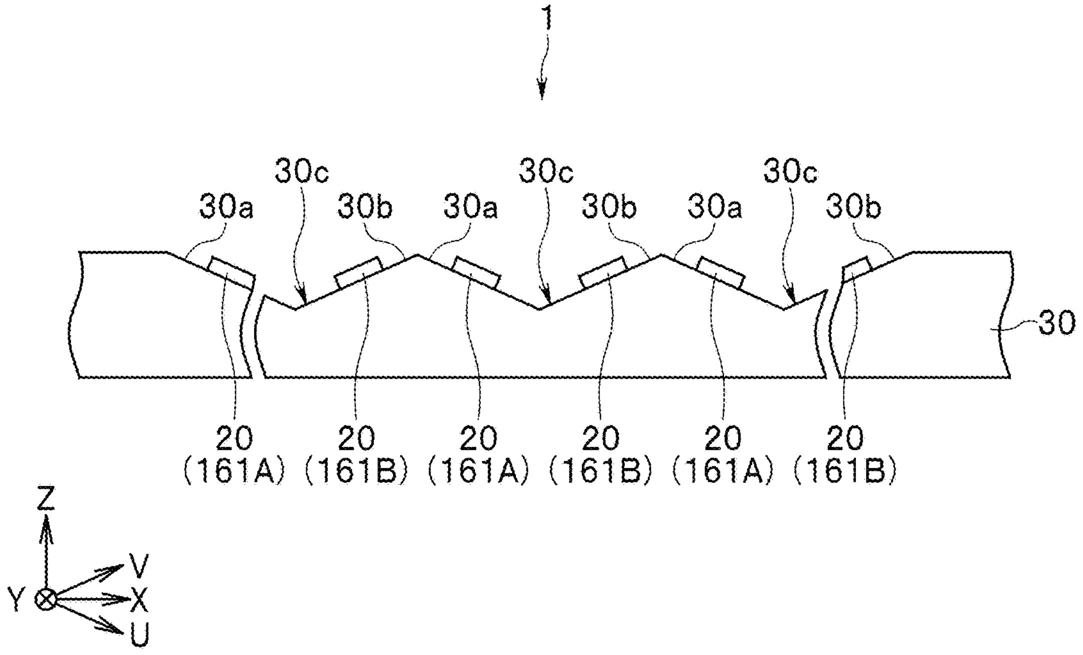
FIG. 15 is a side view showing a part of the magnetic sensor according to the fourth example embodiment of the technology.

Next, a configuration of the magnetic sensor 1 according to the example embodiment will be specifically described with reference to FIGS. 14 and 15. FIG. 14 is a plan view showing a part of the magnetic sensor 1. FIG. 15 is a side view showing a part of the magnetic sensor 1.

The first detection circuit 11 further includes a plurality of structures disposed in the signal paths P11 to P14, and a plurality of first electrodes 81 and a plurality of second electrodes 82 connecting the plurality of structures in series. Each of the signal paths P11 to P14 includes a plurality of arrays. Each of the arrays includes five structures. Each of the five structures is a structure including an MR element 20.

Each of the signal paths P11 to P14 further includes a plurality of sub arrays. Each of the sub arrays includes either more than one structure but fewer than the odd number of structures included in each of the arrays, i.e., fewer than five structures or one structure. In particular, in the example embodiment, each of the more than one structure or the one structure included in each of the sub arrays is a structure including an MR element 20.

The plurality of arrays and the plurality of sub arrays included in the signal path P11 constitute the resistor section R11. The plurality of arrays and the plurality of sub arrays included in the signal path P12 constitute the resistor section R12. The plurality of arrays and the plurality of sub arrays included in the signal path P13 constitute the resistor section R13. The plurality of arrays and the plurality of sub arrays included in the signal path P14 constitute the resistor section R14.

The numbers of MR elements 20 included in the respective signal paths P11 to P14 are the same. The numbers of MR elements 20 included in the respective signal paths P11 to P14 may be an even number.

The second detection circuit 12 further includes a plurality of structures disposed in the signal paths P21 to P24, and a plurality of first electrodes 81 and a plurality of second electrodes 82 connecting the plurality of structures in series. Each of the signal paths P21 to P24 includes a plurality of arrays. Each of the arrays includes five structures. Each of the five structures is an MR element 20.

Each of the signal paths P21 to P24 further includes a plurality of sub arrays. Each of the sub arrays includes either more than one structure but fewer than the odd number of structures included in each of the arrays, i.e., fewer than five structures or one structure. In particular, in the example embodiment, each of the more than one structure or the one structure included in each of the sub arrays is an MR element 20.

The plurality of arrays and the plurality of sub arrays included in the signal path P21 constitute the resistor section R21. The plurality of arrays and the plurality of sub arrays included in the signal path P22 constitute the resistor section R22. The plurality of arrays and the plurality of sub arrays included in the signal path P23 constitute the resistor section R23. The plurality of arrays and the plurality of sub arrays included in the signal path P24 constitute the resistor section R24.

The numbers of MR elements 20 included in the respective signal paths P21 to P24 are the same. The numbers of MR elements 20 included in the respective signal paths P21 to P24 may be an even number.

FIG. 14 shows a plurality of first arrays 161A and a plurality of second arrays 161B among the plurality of arrays. The plurality of first arrays 161A and the plurality of second arrays 161B are disposed so that the first arrays 161A and the second arrays 161B are alternately arranged one by one in the direction parallel to the X direction.

The first arrays 161A and the second arrays 161B are included in respective different signal paths. In the example embodiment, the magnetic sensor 1 includes a first area for laying out the resistor sections R11 and R21, a second area for laying out the resistor sections R12 and R22, a third area for laying out the resistor sections R13 and R23, and a fourth area for laying out the resistor sections R14 and R24. In the first area, the arrays included in the signal path P11 and the arrays included in the signal path P21 correspond to first arrays 161A and second arrays 161B, respectively. In the second area, the arrays included in the signal path P12 and the arrays included in the signal path P22 correspond to first arrays 161A and second arrays 161B, respectively. In the third area, the arrays included in the signal path P13 and the arrays included in the signal path P23 correspond to first arrays 161A and second arrays 161B, respectively. In the fourth area, the arrays included in the signal path P14 and the arrays included in the signal path P24 correspond to first arrays 161A and second arrays 161B, respectively. FIGS. 14 and 15 show a part of one of the first to fourth areas.

In any one of the first to fourth areas, a first array 161A located at the end in the X direction among the plurality of first arrays 161A will be referred to as a specific first array 161A. The second array 161B located at the end in the X direction among the plurality of second arrays 161B will be referred to as a specific second array 161B. When seen in the Z direction, the direction in which the current flows through the specific first array 161A and the direction in which the current flows through the specific second array 161B are the same.

The connection relationship between the five MR elements 20, the plurality of first electrodes 81, and the plurality of second electrodes 82 in each of the first and second arrays 161A and 161B is the same as that between the five MR elements 20, the plurality of first electrodes 81, and the plurality of second electrodes 82 in each of the first and second arrays 61A and 61B shown in FIGS. 6 and 7 according to the first example embodiment.

In FIG. 14, the reference numeral 80 designates a wiring portion constituted by a plurality of first electrodes 81 and a plurality of second electrodes 82. As shown in FIG. 15, the magnetic sensor 1 further includes a support 30 for supporting the plurality of MR elements 20. The support 30 includes a sensor substrate and an insulating portion formed of an insulating material.

The support 30 includes a plurality of groove portions 30*c*. Each of the groove portions 30*c* includes an inclined surface 30*a* and an inclined surface 30*b*. The plurality of first arrays 161A are disposed on the inclined surfaces 30*a* of the respective groove portions 30*c*. The plurality of second arrays 161B are disposed on the inclined surfaces 30*b* of the respective groove portions 30*c*.

Here, as shown in FIG. 15, a U direction and a V direction are defined as follows. The U direction is a direction rotated from the X direction to the −Z direction. The V direction is a direction rotated from the X direction to the Z direction. More specifically, in the present example embodiment, the U direction is set to a direction rotated from the X direction to the –Z direction by α, and the V direction is set to a direction rotated from the X direction to the Z direction by α. Note that α is an angle greater than 0° and smaller than 90°. –U direction refers to a direction opposite to the U direction, and –V direction refers to a direction opposite to the V direction.

The inclined surfaces 30*a* are parallel to an YU plane. The inclined surfaces 30*b* are parallel to an YV plane. The plurality of first arrays 161A can thus be said to be disposed on the inclined surfaces parallel to the YU plane, and the plurality of second arrays 161B on the inclined surfaces parallel to the YV plane.

Although not shown in the drawings, the magnetic sensor 1 further includes an insulating portion. The insulating portion is formed of an insulating material, and covers the plurality of MR elements 20 and the wiring portions 80. In FIG. 15, the plurality of first electrodes 81, the plurality of second electrodes 82, and the insulating portion are omitted.

In FIGS. 12 and 13, solid arrows represent the directions of the magnetization of the magnetization pinned layers 22 of the MR elements 20.

In the example shown in FIG. 12, the direction of the magnetization of the magnetization pinned layer 22 of the MR element 20 in each of the resistor sections R11 and R13 is the U direction. The direction of the magnetization of the magnetization pinned layer 22 of the MR element 20 in each of the resistor sections R12 and R14 is the –U direction. The free layer 24 of the MR element 20 has shape anisotropy that sets the direction of the magnetization easy axis to be in parallel with the Y direction.

In the example shown in FIG. 13, the direction of the magnetization of the magnetization pinned layer 22 of the MR element 20 in each of the resistor sections R21 and R23 is the V direction. The direction of the magnetization of the magnetization pinned layer 22 of the MR element 20 in each of the resistor sections R22 and R24 is the –V direction. The free layer 24 of the MR element 20 has shape anisotropy that sets the direction of the magnetization easy axis to be in parallel with the Y direction.

The target magnetic field (partial magnetic field) for the magnetic sensor 1 to detect can be divided into a first component in a direction parallel to the U direction and a second component in a direction parallel to a direction orthogonal to the U direction. The first detection circuit 11 is configured to detect the first component of the partial magnetic field. More specifically, as the strength of the first component of the partial magnetic field changes, each of the resistor sections R11 to R14 changes in resistance value so that either the resistance values of the resistor sections R11 and R13 increase and the resistance values of the resistor sections R12 and R14 decrease, or the resistance values of the resistor sections R11 and R13 decrease and the resistance values of the resistor sections R12 and R14 increase. This changes the potentials of the respective signal terminals E11 and E12. In the example embodiment, the first detection circuit 11 generates a signal corresponding to the potential of the signal terminal E11 as a first detection signal S11, and generates a signal corresponding to the potential of the signal terminal E12 as a second detection signal S12.

The partial magnetic field can be divided into a third component in a direction parallel to the V direction and a fourth component in a direction parallel to a direction orthogonal to the V direction. The second detection circuit 12 is configured to detect the third component of the partial magnetic field. More specifically, as the strength of the third component of the partial magnetic field changes, each of the resistor sections R21 to R24 changes in resistance value so that either the resistance values of the resistor sections R21 and R23 increase and the resistance values of the resistor sections R22 and R24 decrease, or the resistance values of the resistor sections R21 and R23 decrease and the resistance values of the resistor sections R22 and R24 increase. This changes the potentials of the respective signal terminals E21 and E22. In the example embodiment, the second detection circuit 12 generates a signal corresponding to the potential of the signal terminal E21 as a second detection signal S21, and generates a signal corresponding to the potential of the signal terminal E22 as a second detection signal S22.

The partial magnetic field can also be divided into a first magnetic field component parallel to the Z direction and a second magnetic field component parallel to the X direction. An example of a method for generating a detection value Sz corresponding to the first magnetic field component and a detection value Sx corresponding to the second magnetic field component based on the first detection signals S11 and S12 and the second detection signals S21 and S22 will be described below. The detection values Sx and Sz are generated by a not-shown processor.

For example, the not-shown processor generates the detection values Sx and Sz in the following manner. First, the processor generates a value S1 by an arithmetic including obtainment of the difference S11-S12 between the first detection signal S11 and the first detection signal S12, and generates a value S2 by an arithmetic including obtainment of the difference S21-S22 between the second detection signal S21 and the second detection signal S22. Next, the processor calculates values S3 and S4 using the following expressions (1) and (2).

$$S3 = (S2 + S1)/(2\cos\alpha) \tag{1}$$

$$S4 = (S2 - S1)/(2\sin\alpha) \tag{2}$$

The detection value Sx may be the value S3 itself, or may be a result of a predetermined correction, such as a gain adjustment or an offset adjustment, made to the value S3. In the same manner, the detection value Sz may be the value S4 itself, or may be a result of a predetermined correction, such as a gain adjustment or an offset adjustment, made to the value S4.

Figure 16:
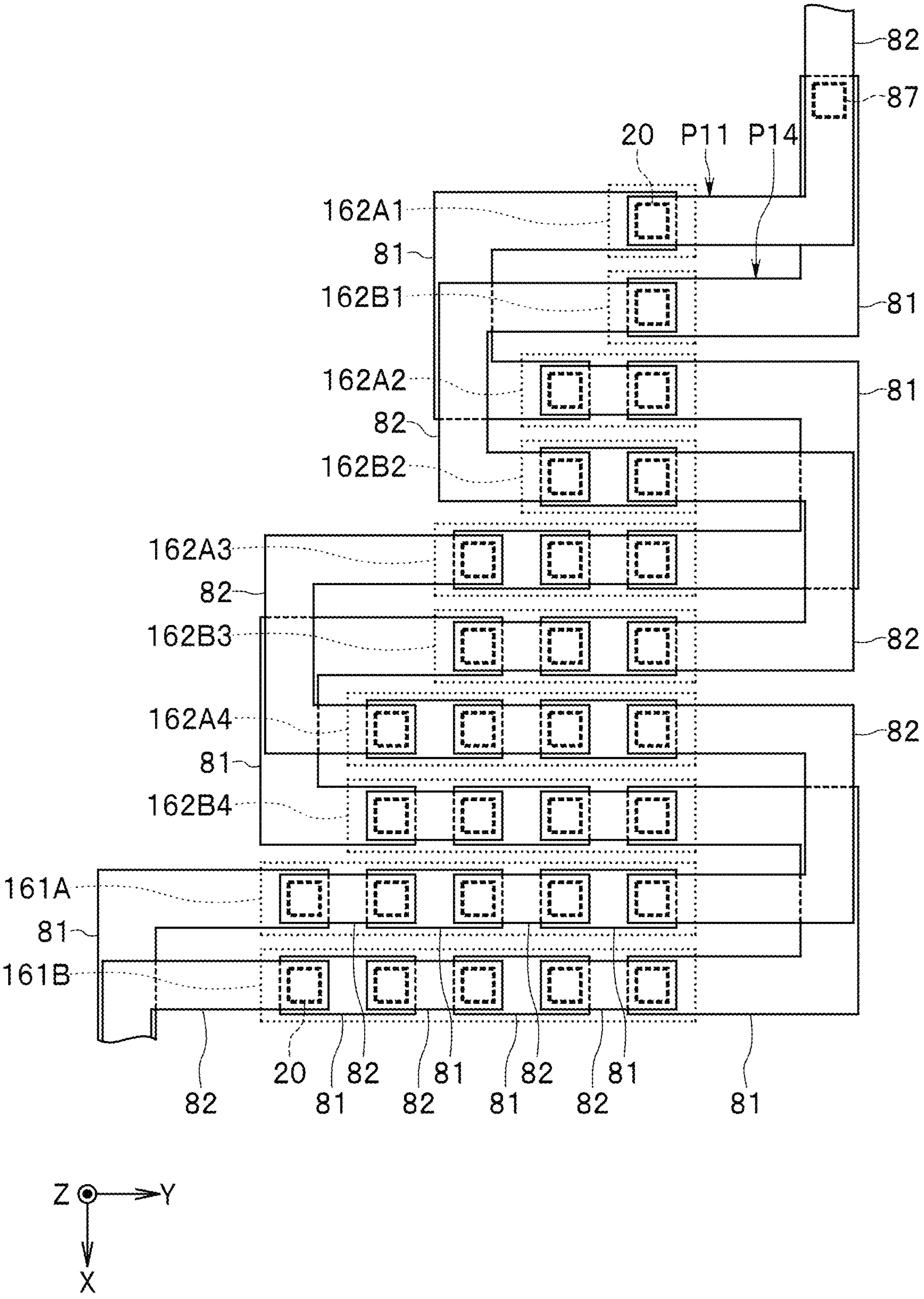
FIG. 16 is a plan view showing a plurality of first sub arrays and a plurality of third sub arrays of the fourth example embodiment of the technology.

Next, the plurality of first electrodes 81 and the plurality of second electrodes 82 in the plurality of sub arrays will be described with reference to FIG. 16. FIG. 16 is a plan view showing a plurality of first sub arrays and a plurality of third sub arrays.

A description will be given below by using the signal paths P11 and P14 as an example. In the following description, the signal path P11 will also be referred to as a first path P11, and the signal path P14 as a second path P14.

The first path P11 includes a plurality of first sub arrays 162A and a plurality of second sub arrays as the plurality of sub arrays. The plurality of first sub arrays 162A are disposed in the first path P11 between one end of the first path P11 and the plurality of first arrays 161A in the first path P11. The plurality of second sub arrays are disposed in the first path P11 between the other end of the first path P11 and the plurality of first arrays 161A in the first path P11. The one end of the first path P11 may be the end of the first path P11 on the side of the power supply terminal V11, for example. The other end of the first path P11 may be the end of the first path P11 on the side of the signal terminal E11, for example.

The second path P14 includes a plurality of third sub arrays 162B and a plurality of fourth sub arrays as the plurality of sub arrays. The plurality of third sub arrays 162B are disposed in the second path P14 between one end of the second path P14 and the plurality of second arrays 161B in the second path P14. The plurality of fourth sub arrays are disposed in the second path P14 between the other end of the second path P14 and the plurality of second arrays 161B in the second path P14. The one end of the second path P14 may be the end of the second path P14 on the side of the power supply terminal V11, for example. The other end of the second path P14 may be the end of the second path P14 on the side of the signal terminal E12, for example.

FIG. 16 shows the plurality of first sub arrays 162A and the plurality of third sub arrays 162B. The plurality of first sub arrays 162A and the plurality of third sub arrays 162B are disposed so that the first sub arrays 162A and the third sub arrays 162B are alternately arranged one by one in the direction parallel to the X direction. The plurality of first electrodes 81 and the plurality of second electrodes 82 are provided so that the first electrodes 81 and the second electrodes 82 are alternately disposed one by one in the current-flowing direction in each of the first and third sub arrays 162A and 162B. The plurality of first electrodes 81 and the plurality of second electrodes 82 thus connect the plurality of structures, i.e., the plurality of MR elements 20 in series.

In the example embodiment, the plurality of first sub arrays 162A are four first sub arrays 162A. The plurality of third sub arrays 162B are four third sub arrays 162B. For the sake of convenience, FIG. 16 shows the four first sub arrays 162A with the reference numerals 162A1, 162A2, 162A3, and 162A4 in order along the X direction. Similarly, for the sake of convenience, FIG. 16 shows the four third sub arrays 162B with the reference numerals 162B1, 162B2, 162B3, and 162B4 in order along the X direction. Note that FIG. 16 also shows a first array 161A connected to the first sub array 162A4 and a second array 161B connected to the third sub array 162B4.

The first sub array 162A1 is the array closest to the end of the first path P11 in the first path P11. The first sub array 162A1 includes one structure, i.e., one MR element 20. The first sub array 162A2 includes two structures, i.e., two MR elements 20. The first sub array 162A3 includes three structures, i.e., three MR elements 20. The first sub array 162A4 includes four structures, i.e., four MR elements 20. In such a manner, the number of structures included in each of the first sub arrays 162A is greater the farther the first sub array 162A is from the one end of the first path P11. In other words, the number of structures included in each of the first sub arrays 162A is smaller the closer the first sub array 162A is to the one end of the first path P11.

The third sub array 162B1 is the array closest to the end of the second path P14 in the second path P14. The third sub array 162B1 includes one structure, i.e., one MR element 20. The third sub array 162B2 includes two structures, i.e., two MR elements 20. The third sub array 162B3 includes three structures, i.e., three MR elements 20. The third sub array 162B4 includes four structures, i.e., four MR elements 20. In such a manner, the number of structures included in each of the third sub arrays 162B is greater the farther the third sub array 162B is from the one end of the second path P14. In other words, the number of structures included in each of the third sub arrays 162B is smaller the closer the third sub array 162B is to the one end of the second path P14.

The one end of the first path P11 and the one end of the second path P14 may be connected to the same electrode pad. In the example shown in FIG. 16, a part of the first path P11 between the first sub array 162A1 and the one end of the first path P11 is constituted by a second electrode 82. A part of the second path P14 between the third sub array 162B1 and the one end of the second path P14 is constituted by a first electrode 81. The foregoing part of the first path P11 and the foregoing part of the second path P14 are thus located at respective different positions in the direction parallel to the Z direction. In such a case, the foregoing part of the first path P11 and the foregoing part of the second path P14 may be connected to each other via a connection structure 87, or specifically, a connection electrode formed of a nonmagnetic metal such as Ta, or a via hole for making the second electrode 82 contact the first electrode 81.

Although not shown in the drawings, the plurality of second sub arrays and the plurality of fourth sub arrays have a similar configuration to that of the plurality of first sub arrays 162A and the plurality of third sub arrays 162B shown in FIG. 16. The number of structures included in each of the second sub arrays is smaller the closer the second sub array is to the other end of the first path P11. The number of structures included in each of the fourth sub arrays is smaller the closer the fourth sub array is to the other end of the second path P14.

The other end of the first path P11 and the other end of the second path P14 may be connected to respective different electrode pads. A part of the first path P11 between the plurality of second sub arrays 163A and the other end of the first path P11 and a part of the second path P14 between the plurality of fourth sub arrays 163B and the other end of the second path P14 do not need to be connected to each other via a connection structure.

Up to this point, the description has been given by using the signal paths P11 and P14 as an example. The foregoing description of the signal paths P11 and P14 also applies to the signal paths P12 and P13. A description of the signal paths P12 and P13 is given by replacing the signal paths P11 and P14 and the power supply terminal V11 in the foregoing description with the signal paths P12 and P13 and the ground terminal G11, respectively.

The description of the signal paths P11 to P14 also applies to the signal paths P21 to P24.

The configuration, operation and effects of the present example embodiment are otherwise the same as those of the first example embodiment.

Fifth Example Embodiment

Figure 17:
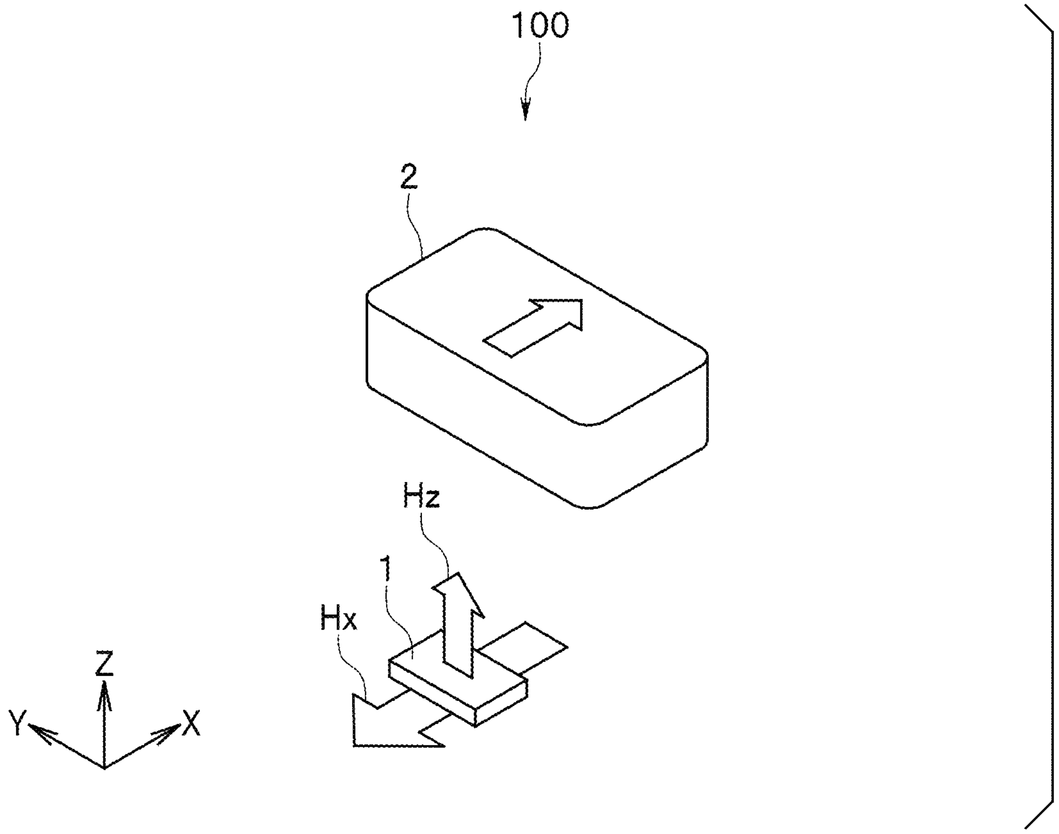
FIG. 17 is a perspective view showing essential parts of a magnetic sensor system according to a fifth example embodiment of the technology.

A fifth example embodiment of the technology will now be described with reference to FIG. 17. FIG. 17 is a perspective view showing essential parts of a magnetic sensor system according to the example embodiment. A magnetic sensor system 100 according to the example embodiment includes a magnetic sensor 1 and a magnetic field generation unit that generates a predetermined magnetic field.

In the example embodiment, the magnetic field generation unit is a magnet 2 configured so that a part of the magnetic field generated, or a partial magnetic field, is applied to the magnetic sensor 1. The partial magnetic field contains a first magnetic field component Hz parallel to the Z direction and a second magnetic field component Hx parallel to the X direction.

In the present example embodiment, as shown in FIG. 17, the magnet 2 is magnetized in the X direction, and the second magnetic field component Hx is in the −X direction. The first magnetic field component Hz is in the Z direction if the magnet 2 moves in the X direction from a predetermined position, and the −Z direction if the magnet 2 moves in the −X direction from the predetermined position.

The magnetic sensor 1 in the magnetic sensor system 100 may be the magnetic sensor 1 according to any one of the first to third example embodiments. In such a case, the magnetic sensor 1 is configured to detect the first magnetic field component Hz as the component of the target magnetic field in the one direction.

Alternatively, the magnetic sensor 1 in the magnetic sensor system 100 may be the magnetic sensor 1 according to the fourth example embodiment. In such a case, the magnetic sensor 1 is configured to detect the first magnetic field component Hz and the second magnetic field component Hx as the components of the target magnetic field in the two directions.

The configuration, operation and effects of the present example embodiment are otherwise the same as those of any of the first to fourth example embodiments.

The technology is not limited to the foregoing example embodiments, and various modifications may be made thereto. For example, each of the arrays may include three structures or seven or more, an odd number of structures as the odd number of structures. Moreover, unlike the description of the example embodiments, the number of pairs of arrays may be other than four. For example, the number of pairs of arrays may be one, or more than one but other than four.

The magnetic sensor 1 according to the first example embodiment may be a half-bridge circuit. More specifically, the magnetic sensor 1 according to the first example embodiment may include a power supply terminal V1, a ground terminal G1, a signal terminal E1, a signal path P1 connecting the power supply terminal V1 and the signal terminal E1, and a signal path P2 connecting the signal terminal E1 and the ground terminal G1 as the power supply terminal, the ground terminal, the signal terminal, the first signal path, and the second signal path.

The first and second detection circuits 11 and 12 according to the fourth example embodiment may be a half-bridge circuit each. Specifically, the first detection circuit 11 may include a power supply terminal V11, a ground terminal G11, a signal terminal E11, a signal path P11 connecting the power supply terminal V11 and the signal terminal E11, and a signal path P12 connecting the signal terminal E11 and the ground terminal G11 as the first power supply terminal, the first ground terminal, the first signal terminal, the first signal path, and the second signal path. The second detection circuit 12 may include a power supply terminal V12, a ground terminal G12, a signal terminal E21, a signal path P21 connecting the power supply terminal V12 and the signal terminal E21, and a signal path P22 connecting the signal terminal E21 and the ground terminal G12 as the second power supply terminal, the second ground terminal, the second signal terminal, the third signal path, and the fourth signal path.

The plurality of first arrays 161A and the plurality of second arrays 161B according to the fourth example embodiment may have the same configuration as that of the plurality of first arrays 61A and the plurality of second arrays 61B according to the second example embodiment or the third example embodiment.

In the fourth example embodiment, the plurality of MR elements 20 in the first detection circuit 11 and the plurality of MR elements 20 in the second detection circuit 12 are not limited to the inclined surfaces 30*a* and 30*b* of the respective groove portions 30*c* and may be formed on the inclined surfaces of respective protrusions protruded from the top surface of the support 30 in the Z direction.

The magnetic sensor according to the technology can be applied to various sensor devices such as a current detection device and an electronic compass for detecting the geomagnetic field.

The magnetic field generation unit of the magnetic sensor system of the technology may be a magnet that is attached to a target object to detect the position of and configured to move along with the movement of the target object. The magnetic sensor system of the technology can thus be used as a magnetic sensor system for detecting the position of various target objects. The magnetic sensor system of the technology can be applied to various sensor devices including a rotation detection device, a relative position detection device, an encoder, an angle detection device, and a magnetic switch.

Application examples of the magnetic sensor system include at least one lens driving mechanism (optical camera shake correction mechanism and autofocus mechanism) in an imaging apparatus such as a camera, disclosed in U.S. patent application Ser. No. 16/877,801 which is incorporated herein by reference. The at least one lens driving mechanism includes a lens, a lens support mechanism that movably supports the lens, and a drive unit that moves the lens. The magnet is attached to the lens support mechanism. The magnetic sensor detects the position of the magnet moving along with the lens.

Another application example of the magnetic sensor system is an artificial joint of an industrial robot or the like, disclosed in U.S. patent application Ser. No. 16/878,008 which is incorporated herein by reference. The artificial joint includes a moving part, a support unit that rotatably supports the moving part, and a joint that couples the moving part with the support unit. The magnetic sensor system of the technology can be applied to the artificial joint, for example, by fixing the magnetic sensor to the support unit and fixing the magnet to the moving part.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:

a first path and a second path through each of which a current flows;

a plurality of structures disposed on the first path and the second path; and a plurality of first electrodes and a plurality of second electrodes that connect the plurality of structures in series, wherein:

the first path includes a plurality of first arrays;

the second path includes a plurality of second arrays;

the plurality of first arrays in the first path and the plurality of second arrays in the second path are disposed so that the first arrays in the first path and the second arrays in the second path are alternately arranged in a first direction;

the plurality of first arrays and the plurality of second arrays each include an odd number of structures among the plurality of structures, the odd number of structures being disposed so as to be arranged in a second direction;

at least one of the odd number of structures is a structure including a magnetoresistive element;

the plurality of first electrodes and the plurality of second electrodes are disposed at different positions in a third direction, and the first electrodes and the second electrodes are alternately arranged in a direction in which the current flows in each of the plurality of first arrays and the plurality of second arrays;

each of the plurality of first arrays in the first path includes a first structure located at an end in one direction parallel to the second direction;

each of the plurality of second arrays in the second path includes a second structure located at an end in the one direction;

the two first structures of two first arrays adjoining with a gap therebetween in the first direction among the plurality of first arrays in the first path are connected to each other by one of the plurality of first electrodes;

the two second structures of two second arrays adjoining with a gap therebetween in the first direction among the plurality of second arrays in the second path are connected to each other by one of the plurality of second electrodes; and when seen in the third direction, at least a part of the one of the plurality of first electrodes overlap at least a part of the one of the plurality of second electrodes with each other.

2. The magnet sensor according to claim 1, wherein:

each of the plurality of first arrays in the first path further includes a third structure located at an end in an opposite direction of the one direction parallel to the second direction;

each of the plurality of second arrays in the second path includes a fourth structure located at an end in the opposite direction;

the two third structures of the two first arrays are connected to each other by another one of the plurality of second electrodes; and the two fourth structures of the two second arrays are connected to each other by another one of the plurality of first electrodes.

3. The magnetic sensor according to claim 2, wherein:

at least a part of the other one of the plurality of first electrodes and at least a part of the other one of the plurality of second electrodes overlap with each other when seen in the third direction.

4. The magnetic sensor according to claim 1, wherein:

each of the odd number of structures has a first surface and a second surface located at both ends in the third direction;

the first surface is connected to one of the first electrodes; and the second surface is connected to one of the second electrodes.

5. The magnetic sensor according to claim 1, wherein a number of the first electrodes included in the plurality of first arrays, a number of the second electrodes included in the plurality of first arrays, a number of the first electrodes included in the plurality of second arrays, and a number of the second electrodes included in the plurality of second arrays are the same.

6. The magnetic sensor according to claim 1, wherein each of the odd number of structures is a structure including the magnetoresistive element.

7. The magnetic sensor according to claim 1, wherein at least one of the odd number of structures other than the structure including the magnetoresistive element is a connection structure configured to connect one of the first electrodes and one of the second electrodes.

8. The magnetic sensor according to claim 1, wherein a number of the magnetoresistive elements included in the first path and a number of the magnetoresistive elements included in the second path are the same.

9. The magnetic sensor according to claim 1, wherein a number of the magnetoresistive elements included in each of the first path and the second path is an even number.

10. The magnetic sensor according to claim 1, wherein:

the plurality of first arrays include a first specific array located at an end in a direction parallel to the first direction;

the plurality of second arrays include a second specific array located at an end in the direction parallel to the first direction; and when seen in the third direction, a direction in which the current flows through the first specific array and a direction in which the current flows through the second specific array are the same.

11. The magnetic sensor according to claim 1, wherein:

the plurality of first arrays include a first specific array located at an end in a direction parallel to the first direction;

the plurality of second arrays include a second specific array located at an end in the direction parallel to the first direction; and when seen in the third direction, a direction in which the current flows through the first specific array and a direction in which the current flows through the second specific array are opposite to each other.

12. The magnetic sensor according to claim 1, further comprising a plurality of yokes each formed of a soft magnetic material, wherein:

the plurality of yokes each have a first end face and a second end face located at both ends in the first direction;

each of the plurality of first arrays is located near the first end face; and each of the plurality of second arrays is located near the second end face.

13. The magnetic sensor according to claim 1, further comprising:

a power supply terminal;

one or two signal terminals, one or two first signal paths connecting the power supply terminal and the one or two signal terminals; and one or two second signal paths connecting the one or two signal terminals and a ground, wherein:

the first path and the second path are two of the one or two first signal paths and the one or two second signal paths.

14. The magnetic sensor according to claim 1, further comprising:

a first power supply terminal;

a second power supply terminal;

one or two first signal terminals;

one or two second signal terminals;

one or two first signal paths connecting the first power supply terminal and the one or two first signal terminals;

one or two second signal paths connecting the one or two first signal terminals and a ground;

one or two third signal paths connecting the second power supply terminal and the one or two second signal terminals; and one or two fourth signal paths connecting the one or two second signal terminals and the ground, wherein:

the first path is one of the one or two first signal paths and the one or two second signal paths; and the second path is one of the one or two third signal paths and the one or two fourth signal paths.

15. The magnetic sensor according to claim 1, wherein:

the first path further includes a first sub array disposed in the first path between one end of the first path and the plurality of first arrays, and a second sub array disposed in the first path between another end of the first path and the plurality of first arrays;

the second path includes a third sub array disposed in the second path between one end of the second path and the plurality of second arrays, and a fourth sub array disposed in the second path between another end of the second path and the plurality of second arrays;

each of the first sub array, the second sub array, the third sub array, and the fourth sub array includes as many structures as the odd number of structures among the plurality of structures;

the as many structures as the odd number of structures are disposed so as to be arranged in the second direction;

at least one of the as many structures as the odd number of structures is a structure including the magnetoresistive element; and the first sub array and the one end of the first path, the second sub array and the other end of the first path, the third sub array and the one end of the second path, and the fourth sub array and the other end of the second path are connected by respective ones of the second electrodes.

16. The magnetic sensor according to claim 1, wherein:

the first path further includes a plurality of first sub arrays disposed in the first path between one end of the first path and the plurality of first arrays, and a plurality of second sub arrays disposed in the first path between another end of the first path and the plurality of first arrays;

the second path further includes a plurality of third sub arrays disposed in the second path between one end of the second path and the plurality of second arrays, and a plurality of fourth sub arrays disposed in the second path between another end of the second path and the plurality of second arrays;

the first sub arrays, the second sub arrays, the third sub arrays, and the fourth sub arrays each include either more than one structure but fewer than the odd number of structures or one structure among the plurality of structures; and each of the more than one structure but fewer than the odd number of structures or the one structure is a structure including the magnetoresistive element.

17. The magnetic sensor according to claim 15, wherein:

a number of the structures included in each of the first sub arrays is smaller the closer the first sub array is to the one end of the first path;

a number of the structures included in each of the second sub arrays is smaller the closer the second sub array is to the other end of the first path;

a number of the structures included in each of the third sub arrays is smaller the closer the third sub array is to the one end of the second path; and a number of the structures included in each of the fourth sub arrays is smaller the closer the fourth sub array is to the other end of the second path.

18. The magnetic sensor according to claim 1, further comprising a plurality of electrode pads to which the first path and the second path are connected, wherein:

the plurality of electrode pads are located at the same position in the third direction.

19. The magnetic sensor according to claim 1, wherein a part of the first path and a part of the second path are located at different positions in the third direction and are connected to each other via a connection structure.

20. The magnetic sensor according to claim 1, wherein the magnetic sensor is configured to detect a component of a target magnetic field in one direction.

21. The magnetic sensor according to claim 1, wherein the magnetic sensor is configured to detect components of a target magnetic field in two directions.

22. A magnetic sensor system comprising:

the magnetic sensor according to claim 1; and a magnetic field generation unit configured to generate a predetermined magnetic field.

* * * * *